(12) United States Patent
Dai et al.

(10) Patent No.: US 8,610,341 B2
(45) Date of Patent: *Dec. 17, 2013

(54) WAVELENGTH CONVERSION COMPONENT

(75) Inventors: Bing Dai, Fremont, CA (US); Xianglong Yuan, Fremont, CA (US); Gang Wang, Milpitas, CA (US); Charles Edwards, Pleasanton, CA (US); James Caruso, Albuquerque, NM (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/273,217

(22) Filed: Oct. 13, 2011

(65) Prior Publication Data

US 2012/0087105 A1 Apr. 12, 2012

Related U.S. Application Data

(63) Continuation-in-part of application No. 13/253,031, filed on Oct. 4, 2011.

(60) Provisional application No. 61/427,411, filed on Dec. 27, 2010, provisional application No. 61/390,091, filed on Oct. 5, 2010.

(51) Int. Cl.
  *H01J 5/16* (2006.01)
(52) U.S. Cl.
  USPC .............................. 313/112; 313/498; 257/98
(58) Field of Classification Search
  USPC ........ 313/112, 498, 501, 512; 257/98; 438/27
  See application file for complete search history.

(56) References Cited

U.S. PATENT DOCUMENTS

| | | | |
|---|---|---|---|
| 3,290,255 A | 12/1966 | Smith | |
| 3,593,055 A | 7/1971 | Geusic et al. | |
| 3,670,193 A | 6/1972 | Thorington et al. | |
| 3,676,668 A | 7/1972 | Collins et al. | |
| 3,691,482 A | 9/1972 | Pinnow et al. | |

(Continued)

FOREIGN PATENT DOCUMENTS

| | | |
|---|---|---|
| CA | 2466979 | 11/2005 |
| EP | 647694 | 4/1995 |

(Continued)

OTHER PUBLICATIONS

Barry, T., Flurrescence of EU2+ Activated Phases in Bunary Alkaline Earth Orthosilicate Systems, Journal of the Electrochemical Society, Nov. 1968, pp. 1181-1184, vol. 115, No. 1.

(Continued)

*Primary Examiner* — Mary Ellen Bowman
(74) *Attorney, Agent, or Firm* — Vista IP Law Group, LLP

(57) ABSTRACT

A light emitting device comprises at least one solid-state light source (LED) operable to generate excitation light and a wavelength conversion component located remotely to the at least one source and operable to convert at least a portion of the excitation light to light of a different wavelength. The wavelength conversion component includes a light diffusing layer having particles of a light scattering material, where the light diffusing layer has a shape with an inner surface that defines an interior volume, and a wavelength conversion layer having particles of at least one photoluminescence material within the interior volume.

31 Claims, 25 Drawing Sheets

(56) References Cited

U.S. PATENT DOCUMENTS

| | | | |
|---|---|---|---|
| 3,709,685 A | 1/1973 | Hercock et al. | |
| 3,743,833 A | 7/1973 | Martie et al. | |
| 3,763,405 A | 10/1973 | Mitsuhata | |
| 3,793,046 A | 2/1974 | Wanmaker et al. | |
| 3,819,973 A | 6/1974 | Hosford | |
| 3,819,974 A | 6/1974 | Stevenson et al. | |
| 3,849,707 A | 11/1974 | Braslau et al. | |
| 3,875,456 A | 4/1975 | Kano et al. | |
| 3,932,881 A | 1/1976 | Mita et al. | |
| 3,937,998 A | 2/1976 | Verstegen et al. | |
| 3,972,717 A | 8/1976 | Wiedemann | |
| 4,047,075 A | 9/1977 | Schoberl | |
| 4,081,764 A | 3/1978 | Christmann et al. | |
| 4,104,076 A | 8/1978 | Pons | |
| 4,143,394 A | 3/1979 | Schoberl | |
| 4,176,294 A | 11/1979 | Thornton, Jr. | |
| 4,176,299 A | 11/1979 | Thornton | |
| 4,191,943 A * | 3/1980 | Cairns et al. | 340/815.42 |
| 4,211,955 A | 7/1980 | Ray | |
| 4,305,019 A | 12/1981 | Graff et al. | |
| 4,315,192 A | 2/1982 | Skwirut et al. | |
| 4,443,532 A | 4/1984 | Joy et al. | |
| 4,559,470 A | 12/1985 | Murakami et al. | |
| 4,573,766 A | 3/1986 | Bournay, Jr. et al. | |
| 4,618,555 A | 10/1986 | Suzuki et al. | |
| 4,638,214 A | 1/1987 | Beers et al. | |
| 4,667,036 A | 5/1987 | Iden et al. | |
| 4,678,285 A | 7/1987 | Ohta et al. | |
| 4,727,003 A | 2/1988 | Ohseto et al. | |
| 4,772,885 A | 9/1988 | Uehara et al. | |
| 4,845,223 A | 7/1989 | Seybold et al. | |
| 4,859,539 A | 8/1989 | Tomko et al. | |
| 4,915,478 A | 4/1990 | Lenko et al. | |
| 4,918,497 A | 4/1990 | Edmond | |
| 4,946,621 A | 8/1990 | Fouassier et al. | |
| 4,992,704 A | 2/1991 | Stinson | |
| 5,077,161 A | 12/1991 | Law | |
| 5,110,931 A | 5/1992 | Dietz et al. | |
| 5,126,214 A | 6/1992 | Tokailin et al. | |
| 5,131,916 A | 7/1992 | Eichenauer et al. | |
| 5,143,433 A | 9/1992 | Farrell | |
| 5,143,438 A | 9/1992 | Giddens et al. | |
| 5,166,761 A | 11/1992 | Olson et al. | |
| 5,208,462 A | 5/1993 | O'Connor et al. | |
| 5,210,051 A | 5/1993 | Carter, Jr. | |
| 5,211,467 A | 5/1993 | Seder | |
| 5,237,182 A | 8/1993 | Kitagawa et al. | |
| 5,264,034 A | 11/1993 | Dietz et al. | |
| 5,283,425 A | 2/1994 | Imamura | |
| 5,369,289 A | 11/1994 | Tamaki et al. | |
| 5,371,434 A | 12/1994 | Rawlings | |
| 5,405,709 A | 4/1995 | Littman et al. | |
| 5,439,971 A | 8/1995 | Hyche | |
| 5,518,808 A | 5/1996 | Bruno et al. | |
| 5,535,230 A | 7/1996 | Abe | |
| 5,557,168 A | 9/1996 | Nakajima et al. | |
| 5,563,621 A | 10/1996 | Silsby | |
| 5,578,839 A | 11/1996 | Nakamura et al. | |
| 5,583,349 A | 12/1996 | Norman et al. | |
| 5,585,640 A | 12/1996 | Huston et al. | |
| 5,619,356 A | 4/1997 | Kozo et al. | |
| 5,660,461 A | 8/1997 | Ignatius et al. | |
| 5,677,417 A | 10/1997 | Muellen et al. | |
| 5,679,152 A | 10/1997 | Tischler et al. | |
| 5,763,901 A | 6/1998 | Komoto et al. | |
| 5,770,887 A | 6/1998 | Tadatomo et al. | |
| 5,771,039 A | 6/1998 | Ditzik | |
| 5,777,350 A | 7/1998 | Nakamura et al. | |
| 5,869,199 A | 2/1999 | Kido | |
| 5,947,587 A | 9/1999 | Keuper et al. | |
| 5,959,316 A | 9/1999 | Lowery | |
| 5,962,971 A | 10/1999 | Chen | |
| 5,998,925 A | 12/1999 | Shimizu | |
| 6,137,217 A | 10/2000 | Pappalardo et al. | |
| 6,147,367 A | 11/2000 | Yang et al. | |
| 6,255,670 B1 | 7/2001 | Srivastava et al. | |
| 6,340,824 B1 | 1/2002 | Komoto et al. | |
| 6,504,301 B1 | 1/2003 | Lowery | |
| 6,538,375 B1 | 3/2003 | Duggal et al. | |
| 6,555,958 B1 | 4/2003 | Srivastava et al. | |
| 6,576,488 B2 | 6/2003 | Collins et al. | |
| 6,576,930 B2 | 6/2003 | Reeh et al. | |
| 6,580,097 B1 | 6/2003 | Soules et al. | |
| 6,600,175 B1 | 7/2003 | Baretz et al. | |
| 6,614,170 B2 | 9/2003 | Wang et al. | |
| 6,642,618 B2 | 11/2003 | Yagi et al. | |
| 6,642,652 B2 | 11/2003 | Collins et al. | |
| 6,680,569 B2 | 1/2004 | Mueller-Mach et al. | |
| 6,717,353 B1 | 4/2004 | Mueller et al. | |
| 6,812,500 B2 | 11/2004 | Reeh et al. | |
| 6,834,963 B1 | 12/2004 | Cleaver et al. | |
| 6,860,628 B2 * | 3/2005 | Robertson et al. | 362/555 |
| 6,869,812 B1 | 3/2005 | Liu | |
| 6,903,380 B2 | 6/2005 | Barnett et al. | |
| 7,029,935 B2 | 4/2006 | Negley et al. | |
| 7,153,015 B2 | 12/2006 | Brukilacchio | |
| 7,220,022 B2 | 5/2007 | Allen et al. | |
| 7,311,858 B2 | 12/2007 | Wang | |
| 7,390,437 B2 | 6/2008 | Dong | |
| 7,479,662 B2 | 1/2009 | Soules et al. | |
| 7,575,697 B2 | 8/2009 | Li | |
| 7,601,276 B2 | 10/2009 | Li | |
| 7,615,795 B2 | 11/2009 | Baretz et al. | |
| 7,655,156 B2 | 2/2010 | Cheng | |
| 7,663,315 B1 | 2/2010 | Hulse | |
| 7,686,478 B1 | 3/2010 | Hulse et al. | |
| 7,943,945 B2 | 5/2011 | Baretz et al. | |
| 7,943,951 B2 | 5/2011 | Kim et al. | |
| 7,972,030 B2 | 7/2011 | Li | |
| 8,274,215 B2 | 9/2012 | Liu | |
| 2001/0000622 A1 | 5/2001 | Reeh et al. | |
| 2002/0047516 A1 | 4/2002 | Iwasa et al. | |
| 2002/0180351 A1 * | 12/2002 | McNulty et al. | 313/512 |
| 2003/0038596 A1 | 2/2003 | Ho | |
| 2003/0052595 A1 | 3/2003 | Ellens et al. | |
| 2003/0102810 A1 | 6/2003 | Cross et al. | |
| 2004/0016908 A1 | 1/2004 | Hohn et al. | |
| 2004/0016938 A1 | 1/2004 | Baretz et al. | |
| 2004/0104391 A1 | 6/2004 | Maeda et al. | |
| 2004/0183081 A1 | 9/2004 | Shishov | |
| 2004/0227465 A1 | 11/2004 | Menkara et al. | |
| 2004/0239242 A1 | 12/2004 | Mano et al. | |
| 2005/0051782 A1 | 3/2005 | Negley et al. | |
| 2005/0052885 A1 | 3/2005 | Wu | |
| 2005/0057917 A1 | 3/2005 | Yatsuda et al. | |
| 2005/0093430 A1 | 5/2005 | Ibbertson et al. | |
| 2005/0168127 A1 | 8/2005 | Shei et al. | |
| 2005/0243550 A1 | 11/2005 | Stekelenburg | |
| 2006/0001352 A1 | 1/2006 | Maruta et al. | |
| 2006/0027786 A1 | 2/2006 | Dong et al. | |
| 2006/0028122 A1 | 2/2006 | Wang et al. | |
| 2006/0028837 A1 | 2/2006 | Mrakovich | |
| 2006/0049416 A1 | 3/2006 | Baretz et al. | |
| 2006/0124947 A1 | 6/2006 | Mueller et al. | |
| 2006/0158090 A1 | 7/2006 | Wang et al. | |
| 2006/0261309 A1 | 11/2006 | Li et al. | |
| 2006/0262532 A1 | 11/2006 | Blumel | |
| 2007/0029526 A1 | 2/2007 | Cheng et al. | |
| 2007/0091601 A1 | 4/2007 | Hsieh et al. | |
| 2007/0120135 A1 * | 5/2007 | Soules et al. | 257/98 |
| 2007/0170840 A1 | 7/2007 | Chang-Hae et al. | |
| 2007/0240346 A1 | 10/2007 | Li et al. | |
| 2008/0111472 A1 | 5/2008 | Liu | |
| 2008/0130285 A1 * | 6/2008 | Negley et al. | 362/257 |
| 2008/0218992 A1 | 9/2008 | Li | |
| 2008/0224597 A1 | 9/2008 | Baretz et al. | |
| 2008/0224598 A1 | 9/2008 | Baretz et al. | |
| 2008/0246044 A1 | 10/2008 | Pang | |
| 2008/0308825 A1 | 12/2008 | Chakraborty et al. | |
| 2009/0026908 A1 | 1/2009 | Bechtel et al. | |
| 2009/0050911 A1 | 2/2009 | Chakraborty | |
| 2009/0272996 A1 * | 11/2009 | Chakraborty | 257/98 |

(56) References Cited

U.S. PATENT DOCUMENTS

| | | | |
|---|---|---|---|
| 2009/0283721 | A1 | 11/2009 | Liu |
| 2011/0147778 | A1 | 6/2011 | Ichikawa |
| 2012/0086034 | A1 | 4/2012 | Yuan |

FOREIGN PATENT DOCUMENTS

| | | |
|---|---|---|
| GB | 2 017 409 | 10/1979 |
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | 07094785 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | 2001177153 A | 6/2001 |
| JP | 2002133910 A | 5/2002 |
| JP | 2003101078 | 4/2003 |
| JP | P2003-234513 | 8/2003 |
| JP | 2005011953 | 1/2005 |
| JP | P3724490 | 9/2005 |
| JP | P3724498 | 9/2005 |
| KR | 10-2007-0065486 | 6/2007 |
| KR | 10-2009-0017346 | 2/2009 |
| RU | 214492 | 6/1998 |
| TW | 200527664 | 8/2005 |
| WO | WO 9108508 | 6/1991 |
| WO | 0207228 | 1/2002 |
| WO | 2004077580 | 9/2004 |
| WO | 2005025831 | 3/2005 |
| WO | 2006022792 | 3/2006 |
| WO | WO 2008019041 A2 | 2/2008 |
| WO | 2008043519 | 4/2008 |
| WO | 2010074963 | 1/2010 |

OTHER PUBLICATIONS

First Office Action for Chinese Patent Application No. 200780032995.8 Issued on Mar. 19, 2010.
Foreign Office Action dated Oct. 29, 2012 for Chinese Appln. No. 200780032995.8.
Second Office Action for Chinese Patent Application No. 200780032995.8 Issued on Aug. 10, 2011.
Third Office Action for Chinese Patent Application No. 200780032995.8 Issued on Dec. 12, 2011.
Foreign Office Action dated Apr. 24, 2012 for Chinese Appln. No. 201010525492.8.
Foreign Office Action dated Jul. 5, 2012 for European Appln. No. 07811039.2.
Foreign Office Action for Japanese Application No. 2009-522877 mailed on Apr. 16, 2013.
Foreign Office Action for Japanese Application No. 2009-522877 mailed on Apr. 24, 2012.
Taiwanese Office Action and Search Report for ROC (Taiwan) Patent Applicatoin No. 096128666 mailed on Sep. 1, 2011.
Non-Final Office Action dated Sep. 27, 2012 for U.S. Appl. No. 13/436,471.
Final Office Action Mailed on Jun. 23, 2009 for U.S. Appl. No. 11/640,533.
Final Office Action Mailed on Sep. 23, 2011 for U.S. Appl. No. 11/640,533.
Final Office Action Mailed on Sep. 9, 2010 for U.S. Appl. No. 11/640,533.
Non-Final Office Action Mailed on Jan. 20, 2010 for U.S. Appl. No. 11/640,533.
Non-Final Office Action Mailed on Mar. 3, 2011 for U.S. Appl. No. 11/640,533.
Non-Final Office Action Mailed on Oct. 27, 2008 for U.S. Appl. No. 11/640,533.
Notice of Allowance Mailed on Aug. 12, 2011 for U.S. Appl. No. 12/624,839.
Notice of Allowance Mailed on Sep. 26, 2011 for U.S. Appl. No. 12/624,839.
Final Office Action dated Jan. 11, 2013 for U.S. Appl. No. 12/624,900.
Final Office Action Mailed on Dec. 19, 2011 for U.S. Appl. No. 12/624,900.
Non-Final Office Action Mailed on Jun. 25, 2012 for U.S. Appl. No. 12/624,900.
Non-Final Office Action Mailed on Mar. 24, 2011 for U.S. Appl. No. 12/624,900.
Final Office Action dated Jan. 30, 2013 for U.S. Appl. No. 13/087,615.
Non-Final Office Action dated Sep. 21, 2012 for U.S. Appl. No. 13/087,615.
Advisory Action dated May 15, 2013 for U.S. Appl. No. 13/436,471.
Final Office Action dated Mar. 1, 2013 for U.S. Appl. No. 13/436,471.
Final Office Action dated Apr. 5, 2013 for U.S. Appl. No. 13/441,714.
Non-Final Office Action dated Sep. 19, 2012 for U.S. Appl. No. 13/441,714.
International Search Report and the Written Opinion dated Aug. 15, 2008 for PCT International Application No. PCT/US2007/017299.
Final Office Action dated Mar. 1, 2013 for U.S. Appl. No. 13/253,031.
Non-Final Office Action dated Oct. 16, 2012 for U.S. Appl. No. 13/253,031.
Final Office Action dated Mar. 1, 2013 for U.S. Appl. No. 13/273,215.
International Search Report and Written Opinion for PCT Application No. PCT/US11/54827.
Supplementary European Search Report for EP 07811039.2, Apr. 15, 2011, 15 pages.
Yoo, J.S., et al., Control of Spectral Properties of Strontium-Alkaline Earth-Silicate-Europiem Phosphors for LED Applications, Journal of the Electrochemical Society, Apr. 1, 2005 pp. G382-G385, vol. 152, No. 5.
International Search Report and Written Opinion dated Mar. 28, 2013 for PCT/US2012/0598292.
Park J.K., et al., Optical Properties of Eu2+ Activated Sr2Sio4 Phosphor for Light-Emitting Diodes, Electrochemical and Solid-State Letters, Feb. 25, 2004, pp. H15-H17, vol. 7, No. 5.
"Fraunhofer-Gesellschafl: Research News Special1997", http://www.fhg.de/press/md-e/md1997/sondert2.hlm,(accessed on Jul. 23, 1998), Jan. 1997, Publisher: Fraunhofer Institute.
Adachi, C. et al., "Blue light-emitting organic electroluminescent devices", "Appl. Phys. Lett.", Feb. 26, 1990, pp. 799-801, vol. 56, No. 9.
Akasaki, Isamu, et al., "Photoluminescence of Mg-doped p-type GaN and electroluminescence of GaN p-n. junction LED", "Journal of Luminescence", Jan.-Feb. 1991, pp. 666-670, vol. 48-49 pt. 2.
Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.
Apr. 14, 2010 Office Action in U.S. Appl. No. 11/264,124.
Apr. 15, 2009 Office Action in U.S. Appl. No. 11/264,124.
Armaroli, N. et al., "Supramolecular Photochemistry and Photophysics.", "J. Am. Chern. Soc.", 1994, pp. 5211-5217, vol. 116.
Aug. 21, 2006 Office Action in U.S. Appl. No. 10/623,198.

(56) References Cited

OTHER PUBLICATIONS

Aug. 24, 2007 Office Action in U.S. Appl. No. 11/264,124.
Aug. 26, 2010 Office Action in U.S. Appl. No. 12/131,118.
Berggren, M. et al., "Light-emitting diodes with variable colours from polymer blends", "Nature", Dec. 1, 1994, pp. 444-446, vol. 372.
Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.
Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.
Bradfield, P.L., et al., "Electroluminescence from sulfur impurities in a p-n junction formed in epitaxial silicon", "Appl. Phys. Lett", 07110/1989, pp. 10D-102, vol. 55, No. 2.
Chao, Zhang Jin, et al., "White light emitting glasses", "Journal of Solid State Chemistry", 1991, pp. 17-29, vol. 93.
Comrie, M. , "Full Color LED Added to Lumex's Lineup", "EBN", Jun. 19, 1995, p. 28.
CRC Handbook, 63rd Ed., (1983) p. E-201.
Das, N. C., et al., "Luminescence spectra of ann-channel metal-oxide-semiconductor field-effect transistor at breakdown", 1990, pp. 1152-1153, vol. 56, No. 12.
Dec. 16, 2004 Office Action in U.S. Appl. No. 10/623,198.
Dictionary Definition of Phosphor, Oxford English Dictionary Online, Mar. 9, 2012 (Only partial available due to corrupt file as provided by, on Mar. 22, 2012 in U.S. Appl. No. 12/131,119; Request for Full Reference filed).
El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.
Feb. 21, 2012 Office Action in U.S. Appl. No. 12/131,118.
Feb. 26, 2008 Office Action in U.S. Appl. No. 11/264,124.
Feb. 4, 2005 Office Action in U.S. Appl. No. 10/623,198.
Feb. 7, 2007 Office Action in U.S. Appl. No. 11/264,124.
Forrest, S. et al. , "Organic emitters promise a new generation of displays", "Laser Focus World ", Feb. 1995, pp. 99-107.
Hamada,Y. et al. , "Blue-Light-Emitting Organic Electroluminescent Devices with Oxadiazole Dimer Dyes as an Emitter", "Jpn. J. Appl. Physics", Jun. 1992, pp. 1812-1816, vol. 31.
Hamakawa, Yoshihiro, et al., "Toward a visible light display by amorphous SiC:H alloy system", "Optoelectronics—Devices and Technologies", Dec. 1989, pp. 281-294, vol. 4, No. 2.
Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.
Jang, S., "Effect of Avalanche-Induced Light Emission on the Multiplication Factor in Bipolar Junction Transistors", "Solid-State Electronics", 1991, pp. 1191-1196, vol. 34, No. 11.
Jan. 29, 2007 Office Action in U.S. Appl. No. 10/623,198.
Jan. 30, 2006 Office Action in U.S. Appl. No. 11/264,124.
Jan. 7, 2011 Office Action in U.S. Appl. No. 12/131,119.
Jul. 10, 2008 Office Action in U.S. Appl. No. 11/264,124.
Jul. 14, 2005 Notice of Allowance, Notice of Allowability, and Examiner's Statement of Reasons for Allowance in U.S. Appl. No. 10/623,198.
Jul. 14, 2011 Office Action in U.S. Appl. No. 12/131,119.
Jul. 7, 2011 Office Action in U.S. Appl. No. 12/131,118.
Jun. 14, 2006 Office Action in U.S. Appl. No. 11/264,124.
Jun. 26, 2007 Office Action in U.S. Appl. No. 10/623,198.
Kido, J. et al. , "1,2,4-Triazole Derivative as an Electron Transport Layer in Organic Luminescent Devices", "Jpn. J. Appl. Phys. ", Jul. 1, 1993, pp. L917-L920, vol. 32.
Kido, J. et al. , "Bright blue electroluminescence from poly(N-vinylcarbazole)", "Appl. Phys. Letters", Nov. 8, 1993, pp. 2627-2629, vol. 63, No. 19.
Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.
Krames, M., et al., "Status and Future of High-Power Light-Emitting Diodes for Solid-Slate Lighting", "Journal of Display Technology", Jun. 2007, pp. 160-175, vol. 3, No. 2.
Kudryashov, V., et al., "Spectra of Superbright Blue and Green InGaN/AIGaN/GaN Light-Emitting diodes", "Journal of the European Ceramic Society", May 1996, pp. 2033-2037, vol. 17.
Larach, S., et al., "Blue emitting luminescent phosphors: Review and status", "Int'l Workshop on Electroluminescence", 1990, pp. 137-143.
LEDs and Laser Diodes, Electus Distribution, copyright 2001, available at URL:http://www.jaycar.com.au/images_uploaded/ledlaser. Pdf.
Lester, S., et al., "High dislocation densities in high efficiency GaN-based light-emitting diodes", "Appl. Phys. Lett.", Mar. 6, 1995, pp. 1249-1251, vol. 66, No. 10.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn:documentum:eCommerce_soi_EU:09007bb280021e27.pdf:09007bb280021e27.pdf.
Mar. 2, 2009 Office Action in U.S. Appl. No. 10/623,198.
Mar. 22, 2012 Office Action in U.S. Appl. No. 12/131,119.
Mar. 28, 2006 Office Action in U.S. Appl. No. 10/623,198.
Mar. 4, 2011 Notice of Allowance, Notice of Allowability, Examiner's Interview Summary, Examiners Amendment/Comment and Examiner's Statement of Reason for Allowance in U.S. Appl. No. 11/264,124.
Mar. 7, 2008 Office Action in U.S. Appl. No. 10/623,198.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.
Mimura, Hidenori, et al., "Visible electroluminescence from uc-SiC/porous Si/c-Si p-n junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30, 2010 Office Action in U.S. Appl. No. 12/131,118.
Oct. 20, 2008 Office Action in U.S. Appl. No. 10/623,198.
Pankove, J.I., et al., "Scanning electron microscopy studies of GaN", "Journal of Applied Physics", Apr. 1975, pp. 1647-1652, vol. 46, No. 4.

(56) References Cited

OTHER PUBLICATIONS

Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.

Pei, Q, et al., "Polymer Light-Emitting Electrochemical Cells", "Science", Aug. 25, 1995, pp. 1086-1088, vol. 269, No. 5227.

Reexam Advisory Action dated Sep. 28, 2012 for U.S. Appl. No. 90/010,940.

Reexam Final Office Action dated May 24, 2012 for U.S. Appl. No. 90/010,940.

Reexam Final Office Action dated Nov. 7, 2011 for U.S. Appl. No. 90/010,940.

Reexam Non-Final Office Action dated Jan. 26, 2012 for U.S. Appl. No. 90/010,940.

Reexam Non-Final Office Action dated Mar. 3, 2011 for U.S. Appl. No. 90/010,940.

Reexam Non-Final Office Action dated Sep. 20, 2010 for U.S. Appl. No. 90/010,940.

Roman. D., "LEDs Turn A Brighter Blue", "Electronic Buyers' News", Jun. 19, 1995, pp. 28 and 35, vol. 960, Publisher: CMP Media LLC.

Saleh and Teich, Fundamentals of Photonics, New York: John Wiley & Sons, 1991, pp. 592-594.

Sato, Yuichi, et al., "Full-color fluorescent display devices using a near-UV light-emitting diode", "Japanese Journal of Applied Physics", Jul. 1996, pp. L838-L839, vol. 35, No. ?A.

Sep. 17, 2009 Notice of Allowance, Notice of Allowability, Examiner's Amendmeni/Comment, and Examiner's Statement of Reasons for Allowance in U.S. Appl. No. 10/623,198.

Sep. 29, 2009 Office Action in U.S. Appl. No. 11/264,124.

Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.

Tanaka, Shosaku, et al., "White Light Emitting Thin-Film Electroluminescent Devices with SrS:Ce,CI/ZnS:Mn Double Phosphor Layers", "Jpn. J. Appl. Phys.", Mar. 20, 1986, pp. L225-L227, vol. 25, No. 3.

The Penguin Dictionary of Electronics, 3rd edition, pp. 315,437-438, 509-510, copyright 1979, 1988, and 1998.

Ura, M. , "Recent trends of development of silicon monocarbide blue-light emission diodes", "Kinzoku", 1989, pp. 11-15, vol. 59, No. 9.

Werner, K. , "Higher Visibility for LEDs", "IEEE Spectrum", Jul. 1994, pp. 30-39.

Wojciechowski, J. et al. , "Infrared-To-Blue Up-Converting Phosphor", "Electron Technology", 1978, pp. 31-47, vol. 11, No. 3.

Yamaguchi, Y. et al., "High-Brightness SiC Blue LEDs and Their Application to Full Color LED Lamps", "Optoelectronics-Devices and Technologies", Jun. 1992, pp. 57-67, vol. 7, No. 1.

Yang, Y., et al., "Voltage controlled two color light-emitting electrochemical cells", "Appl. Phys. Lett.", 1996, vol. 68, No. 19.

Yoshimi, Masashi, et al., "Amorphous carbon basis blue light electroluminescent device", "Optoelectronics—Devices and Technologies", Jun. 1992, pp. 69-81, vol. 7, No. 1.

Zanoni, E., et al., "Impact ionization, recombination, and visible light emission in ALGaAs/GaAs high electron mobility transistors", "J. Appl. Phys.", 1991, pp. 529-531, vol. 70, No. 1.

Zanoni, E., et al., "Measurements of Avalance Effects in Advanced Si and SiGe Bipolar Transistors", "Microelectronic Engineering", 1991, pp. 23-26, vol. 15.

Zdanowski, Marek, "Pulse operating up-converting phosphor LED", "Electron Technol.", 1978, pp. 49-61, vol. 11, No. 3.

Himing, Chen, et al., "Amorphous thin film white-LED and its light-emitting mechanism", "Conference Record of the 1991 International Display Research Conference", Oct. 1991, pp. 122-125.

Non-Final Office Action dated Jun. 13, 2013 for U.S. Appl. No. 13/253,031.

Non-Final Office Action dated Sep. 24, 2012 for U.S. Appl. No. 13/273,215.

Non-Final Office Action dated Sep. 24, 2012 for U.S. Appl. No. 13/273,212.

Final Office Action dated Mar. 6, 2013 for U.S. Appl. No. 13/273,212.

Foreign Office Action dated Mar. 19, 2013 for Chinese Appln. No. 201010525492.8.

International Preliminary Report on Patentability dated Apr. 9, 2013 for PCT Application No. PCT/US11/54827.

Fourth Office Action dated May 15, 2013 for Chinese Appln. No. 200780032995.8.

Non-Final Office Action dated May 16, 2013 for U.S. Appl. No. 13/087,615.

Non-Final Office Action dated Jun. 14, 2013 for U.S. Appl. No. 13/273,215.

Non-Final Office Action dated Jun. 17, 2013 for U.S. Appl. No. 13/273,212.

Non-Final Office Action dated Jul. 18, 2013 for U.S. Appl. No. 13/436,471.

Non-Final Office Action Mailed on Jul. 25, 2013 for U.S. Appl. No. 11/640,533.

International Search Report and Written Opinion dated Sep. 27, 2013 for PCT Appln. No. PCT/US13/48354.

Notice of Allowance dated Sep. 24, 2013 for U.S. Appl. No. 13/273,212.

Notice of Allowance dated Sep. 30, 2013 for U.S. Appl. No. 13/273,215.

Non-Final Office Action dated Sep. 27, 2013 for U.S. Appl. No. 12/624,900.

Notice of Allowance dated Oct. 2, 2013 for U.S. Appl. No. 13/253,031.

* cited by examiner

WAVELENGTH CONVERSION COMPONENT

CROSS-REFERENCE TO RELATED APPLICATIONS

This application claims the benefit of priority to U.S. Provisional Patent Application Ser. No. 61/427,411, entitled "Solid-State Light Emitting Devices with Remote Phosphor Wavelength Conversion Component", filed Dec. 27, 2010, which is hereby incorporated by reference in its entirety. This application is also a continuation-in-part of U.S. application Ser. No. 13/253,031, entitled "Solid-State Light Emitting Devices and Signage with Photoluminescence Wavelength Conversion," filed on Oct. 4, 2011, which claims the benefit of U.S. Provisional Patent Application Ser. No. 61/390,091, entitled "Solid-State Light Emitting Devices and Signage with Photoluminescence Wavelength Conversion," filed on Oct. 5, 2010, which is hereby incorporated by reference in its entirety.

FIELD

This disclosure relates to solid-state light emitting devices that use a remotely positioned phosphor wavelength conversion component to generate a desired color of light.

BACKGROUND

White light emitting LEDs ("white LEDs") are known and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more one or more photoluminescent materials (e.g., phosphor materials), which absorb a portion of the radiation emitted by the LED and re-emit light of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor material combined with the light emitted by the phosphor provides light which appears to the eye as being nearly white in color. Alternatively, the LED chip or die may generate ultraviolet (UV) light, in which phosphor(s) to absorb the UV light to re-emit a combination of different colors of photoluminescent light that appear white to the human eye.

Due to their long operating life expectancy (>50,000 hours) and high luminous efficacy (70 lumens per watt and higher) high brightness white LEDs are increasingly being used to replace conventional fluorescent, compact fluorescent and incandescent light sources.

Typically the phosphor material is mixed with light transmissive materials, such as silicone or epoxy material, and the mixture applied to the light emitting surface of the LED die. It is also known to provide the phosphor material as a layer on, or incorporate the phosphor material within, an optical component, a phosphor wavelength conversion component, that is located remotely to the LED die ("remote phosphor" LED devices).

One issue with remote phosphor devices is the non-white color appearance of the device in its OFF state. During the ON state of the LED device, the LED chip or die generates blue light and the phosphor(s) absorbs a percentage of the blue light and re-emits yellow light or a combination of green and red light, green and yellow light, green and orange, or yellow and red light. The portion of the blue light generated by the LED that is not absorbed by the phosphor combined with the light emitted by the phosphor provides light which appears to the human eye as being nearly white in color. However, for a remote phosphor device in its OFF state, the absence of the blue light that would otherwise be produced by the LED in the ON state causes the device to have a yellowish, yellow-or-ange, or orange-color appearance. A potential consumer or purchaser of such devices that is seeking a white-appearing light may be quite confused by the yellowish, yellow-orange, or orange-color appearance of such devices in the marketplace, since the device on a store shelf is in its OFF state. This may be off-putting or undesirable to the potential purchasers and hence cause loss of sales to target customers.

Another problem with remote phosphor devices can be the variation in color of emitted light with emission angle. In particular, such devices are subject to perceptible non-uniformity in color when viewed from different angles. Such visually distinctive color differences are unacceptable for many commercial uses, particularly for the high-end lighting that often employ LED lighting devices.

Yet another problem with using phosphor materials is that they are relatively costly, and hence correspond to a significant portion of the costs for producing phosphor-based LED devices. For a non-remote phosphor device, the phosphor material in a LED light is typically mixed with a light transmissive material such as a silicone or epoxy material and the mixture directly applied to the light emitting surface of the LED die. This results in a relatively small layer of phosphor materials placed directly on the LED die, that is nevertheless still costly to produce in part because of the significant costs of the phosphor materials. A remote phosphor device typically uses a much larger layer of phosphor materials as compared to the non-remote phosphor device. Because of its larger size, a much greater amount of phosphor is normally required to manufacture such remote phosphor LED devices. As a result, the costs are correspondingly greater as well to provide the increased amount of phosphor materials needed for such remote phosphor LED devices.

Therefore, there is a need for improved approaches to implement LED lighting apparatuses that maintains the desired color properties of the devices, but without requiring the large quantities of photoluminescent materials (e.g. phosphor materials) that are required in the prior approaches. In addition, there is a need for an improved approach to implement LED lighting apparatuses which addresses perceptible variations in color of emitted light with emission angle, and which also addresses the non-white color appearance of the LED lighting apparatuses while in an OFF state.

SUMMARY OF THE INVENTION

Embodiments of the invention concern light emitting devices comprising one or more solid-state light sources, typically LEDs, that are operable to generate excitation radiation (typically blue light) and a remote wavelength conversion component, containing one or more excitable photoluminescence materials (e.g., phosphor materials), that is operable to convert at least a portion of the excitation radiation to light of a different wavelength. When using a blue light radiation source, the emission product of the device comprises the combined light generated by the source and the wavelength conversion component and is typically configured to appear white in color. When using an UV source, the wavelength conversion component(s) may include a blue wavelength conversion component and a yellow wavelength conversion component with the outputs of these components combining to form the emission product. The wavelength conversion component comprises a light transmissive substrate such as a polymer or glass having a wavelength conversion layer comprising particles of the excitable photoluminescence material (such as phosphor) and a light diffusing layer comprising particles of a light diffractive material (such as titanium dioxide). In accordance with some embodiments of the invention, the wavelength conversion and light diffusing layers are in direct contact with each other and are preferably deposited by screen printing or slot die coating. As used herein, "direct contact" means that there are no intervening layers or air gaps.

One benefit of this approach is that by selecting an appropriate particle size and concentration per unit area of the light diffractive material, an improvement is obtained in the white color appearance of a LED device in its OFF state. Another benefit is an improvement to the color uniformity of emitted light from an LED device for emission angles over a ±60° range from the emission axis. Moreover the use of a light diffusing layer having an appropriate particle size and concentration per unit area of the light diffractive material can substantially reduce the quantity of phosphor material required to generate a selected color of emitted light, since the light diffusing layer increases the probability that a photon will result in the generation of photoluminescence light by directing light back into the wavelength conversion layer. Therefore, inclusion of a diffusing layer in direct contact with the wavelength conversion layer can reduce the quantity of phosphor material required to generate a given color emission product, e.g., by up to 40%. In one embodiment the particle size of the light diffractive material is selected such that excitation radiation generated by the source is scattered more than light generated by the one or more phosphor materials.

According to some embodiments of the invention a wavelength conversion component for a light emitting device comprising at least one light emitting solid-state radiation source, comprises a light transmissive substrate having a wavelength conversion layer comprising particles of at least one photoluminescence material and a light diffusing layer comprising particles of a light diffractive material; and wherein the layers are in direct contact with each other. Preferably the wavelength conversion layer comprises a mixture of at least one phosphor material and a light transmissive binder while the light diffusing layer comprises a mixture of the light diffractive material and a light transmissive binder. To minimize optical losses at the interface of the layers it is preferred that the layers comprise the same transmissive binder. The binder can comprise a curable liquid polymer such as a polymer resin, a monomer resin, an acrylic, an epoxy, a silicone or a fluorinated polymer. The binder is preferably UV or thermally curable.

To reduce the variation in emitted light color with emission angle the weight loading of light diffractive material to binder is in a range 7% to 35% and more preferably in a range 10% to 20%. The wavelength conversion and light diffusing layers are preferably deposited by screen printing though they can be deposited using other deposition techniques such as spin coating or doctor blading. The light diffractive material preferably comprises titanium dioxide ($TiO_2$) though it can comprise other materials such as barium sulfate ($BaSO_4$), magnesium oxide (MgO), silicon dioxide ($SiO_2$) or aluminum oxide ($Al_2O_3$).

In one arrangement the light diffractive material has an average particle size in a range 1 μm to 50 μm and more preferably in a range 10 μm to 20 μm. In other arrangements the light diffractive material has a particle size that is selected such that the particles will scatter excitation radiation relatively more than they will scatter light generated by the at least one photoluminescence material. For example, for blue light radiation sources, the light diffractive particle size can be selected such that the particles will scatter blue light relatively at least twice as much as they will scatter light generated by the at least one phosphor material. Such a light diffusing layer ensures that a higher proportion of the blue light emitted from the wavelength conversion layer will be scattered and directed by the light diffractive material back into the wavelength conversion layer increasing the probability of the photon interacting with a phosphor material particle and resulting in the generation of photoluminescent light. At the same time, phosphor generated light can pass through the diffusing layer with a lower probability of being scattered. Since the diffusing layer increases the probability of blue photons interacting with a phosphor material particle, less phosphor material can be used to generate a selected emission color. Such an arrangement can also increase luminous efficacy of the wavelength conversion component/device. Preferably the light diffractive material has an average particle size of less than about 150 nm where the excitation radiation comprises blue light. When the excitation radiation comprises UV light, the light diffractive material may have an average particle size of less than about 100 nm.

The light transmissive substrate can comprise any material that is substantially transmissive to visible light (380 nm to 740 nm) and typically comprises a polymer material such as a polycarbonate or an acrylic. Alternatively the substrate can comprise a glass.

The concept of a wavelength conversion component having a light diffusing layer composed of light diffractive particles that preferentially scatter light corresponding to wavelengths generated by the LEDs compared with light of wavelengths generated by the phosphor material is considered inventive in its own right. According to a further aspect of the invention a wavelength conversion component for a light emitting device comprising at least one blue light emitting solid-state light source, comprises a wavelength layer comprising particles of at least one phosphor material and a light diffusing layer comprising particles of a light diffractive material; wherein the light diffractive particle size is selected such that the particles will scatter excitation radiation relatively more than they will scatter light generated by the at least one phosphor material.

To increase the CRI (Color Rendering Index) of light generated by the device the device can further comprise at least one solid-state light source operable to generate red light.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood LED-based light emitting devices and phosphor wavelength conversion components in accordance with the invention will now be described, by way of example only, with reference to the accompanying drawings in which like reference numerals are used to denote like parts, and in which.

DETAILED DESCRIPTION OF THE INVENTION

Some embodiments of the invention are directed to light emitting devices comprising one or more solid-state light emitters, typically LEDs, that is/are operable to generate excitation light (typically blue or UV) which is used to excite a wavelength conversion component containing particles of a photoluminescence materials (e.g. phosphor materials), such as a blue light excitable phosphor material or an UV excitable phosphor material. Additionally the wavelength conversion component comprises a light diffusing layer comprising particles of a light diffractive material (also referred to herein as "light scattering material"). One benefit of this arrangement is that by selecting an appropriate particle size and concentration per unit area of the light diffractive material, it is possible to make a device having an emission product color that is virtually uniform with emission angle over a ±60° range from the emission axis. Moreover the use of a light diffusing layer can substantially reduce the quantity of phosphor material required to generate a selected color of emitted light. In addition, the light diffusing layer can significantly improve the white appearance of the light emitting device in its OFF state.

For the purposes of illustration only, the following description is made with reference to photoluminescence material embodied specifically as phosphor materials. However, the invention is applicable to any type of any type of photoluminescence material, such as either phosphor materials or quantum dots. A quantum dot is a portion of matter (e.g. semiconductor) whose excitons are confined in all three spatial dimensions that may be excited by radiation energy to emit light of a particular wavelength or range of wavelengths. In addition, the following description is made with reference to radiation sources embodied specifically as blue light sources. However, the invention is applicable any type of radiation source, including blue light sources and UV light sources.

Figure 1:
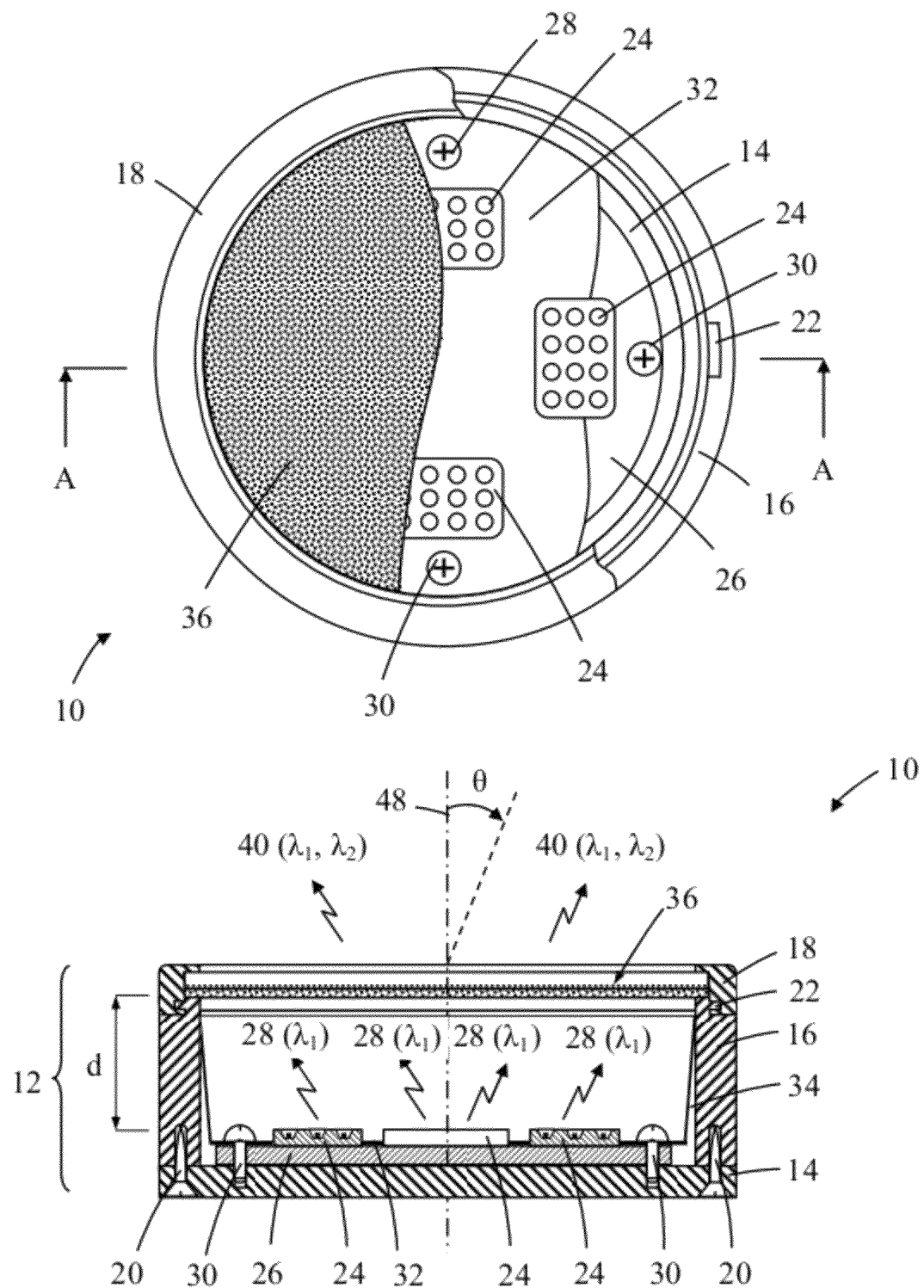
FIG. 1 shows schematic partial cutaway plan and sectional views of a solid-state light emitting device in accordance with an embodiment of the invention.

A solid-state light emitting device 10 in accordance with an embodiment of the invention will now be described with reference to FIG. 1 which shows schematic partial cutaway plan and sectional views of the device. The device 10 is configured to generate warm white light with a CCT (Correlated Color Temperature) of approximately 3000K and a luminous flux of approximately 1000 lumens.

The device 10 comprises a hollow cylindrical body 12 composed of a circular disc-shaped base 14, a hollow cylindrical wall portion 16 and a detachable annular top 18. To aid in the dissipation of heat the base 14 is preferably fabricated from aluminum, an alloy of aluminum or any material with a high thermal conductivity (preferably ≥200 $\mu m^{-1} K^{-1}$) such as for example copper, a magnesium alloy or a metal loaded plastics material. For low cost production the wall 16 and top 18 are preferably fabricated from a thermoplastics material such as HDPP (High Density Polypropylene), nylon or PMA (polymethyl acrylate). Alternatively they can be fabricated from a thermally conductive material such as aluminum or an aluminum alloy. As indicated in FIG. 1 the base 14 can be attached to the wall portion 16 by screws or bolts 20 or by other fasteners or by means of an adhesive. As further shown in FIG. 1 the top 18 can be detachably mounted to the wall portion 16 using a bayonet-type mount in which radially extending tabs 22 engage in a corresponding annular groove in the top 18.

The device 10 further comprises a plurality (four in the example illustrated) of blue light emitting LEDs 24 (blue LEDs) that are mounted in thermal communication with a circular-shaped MCPCB (metal core printed circuit board) 26. The blue LEDs 24 can comprise 4.8 W Cetus™ C1109 chip on ceramic devices from Internatix Corporation of Fremont, Calif. in which each device comprises a ceramic packaged array of twelve 0.4 W GaN-based (gallium nitride-based) blue LED chips that are configured as a rectangular array 3 rows by 4 columns. Each blue LED 24 is operable to generate blue light 28 having a peak wavelength $\lambda_1$ in a wavelength range 400 nm to 480 nm (typically 450 nm to 470 nm). As is known an MCPCB comprises a layered structure composed of a metal core base, typically aluminum, a thermally conductive/electrically insulating dielectric layer and a copper circuit layer for electrically connecting electrical components in a desired circuit configuration. The metal core base of the MCPCB 26 is mounted in thermal communication with the base 14 with the aid of a thermally conductive compound such as for example an adhesive containing a standard heat sink compound containing beryllium oxide or aluminum nitride. As shown in FIG. 1 the MCPCB can be attached to the base using screws or bolts 30.

To maximize the emission of light, the device 10 can further comprise light reflective surfaces 32, 34 that respectively cover the face of the MCPCB 26 and the inner curved surface of the top 18. Typically the light reflective surfaces 32, 34 can comprise a highly light reflective sheet material such as WhiteOptics™ "White 97" (A high-density polyethylene fiber-based composite film) from A.L.P. lighting Components, Inc of Niles, Ill., USA. As indicated in FIG. 1 a circular disc 32 of the material can be used to cover the face of the MCPCB and a strip of the light reflective material configured as a cylindrical sleeve 34 that is inserted in the housing and is configured to cover the inner surface of the housing wall portion 16.

The device 10 further comprises a phosphor wavelength conversion component 36 that is operable to absorb a proportion of the blue light 28 (14 generated by the LEDs 24 and convert it to light 38 of a different wavelength ($\lambda_2$) by a process of photoluminescence 36. The emission product 40 of the device 10 comprises the combined light of wavelengths $\lambda_1$, $\lambda_2$ generated by the LEDs 24 and the phosphor wavelength conversion component 36. The wavelength conversion component is positioned remotely to the LEDs 24 and is spatially separated from the LEDs a distance d that is typically at least 1 cm. In this patent specification "remotely" and "remote" means in a spaced or separated relationship. The wavelength conversion component 36 is configured to completely cover the housing 12 opening such that all light emitted by the lamp passes through the component 36. As shown the wavelength conversion component 36 can be detachably mounted to the top of the wall portion 16 using the top 18 enabling the component and emission color of the lamp to be readily changed.

Figure 2:
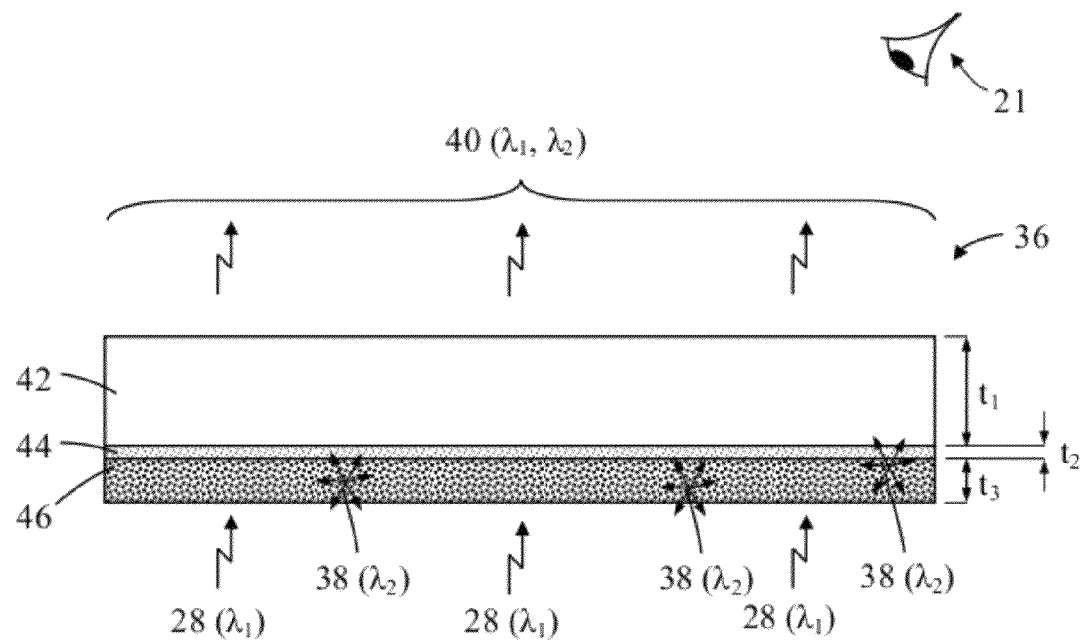
FIG. 2 is a schematic of a phosphor wavelength conversion component in accordance with an embodiment of the invention.

As shown in FIG. 2, the wavelength conversion component 36 comprises, in order, a light transmissive substrate 42, a light diffusing layer 44 containing light diffractive particles and a wavelength conversion layer 46 containing one or more photoluminescent (e.g., phosphor) materials. As can be seen in FIG. 2 the wavelength conversion component 36 is configured such that in operation the wavelength conversion layer 46 faces the LEDs.

The light transmissive substrate 42 can be any material that is substantially transmissive to light in a wavelength range 380 nm to 740 nm and can comprise a light transmissive polymer such as a polycarbonate or acrylic or a glass such as a borosilicate glass. For the lamp 10 of FIG. 1 the substrate 42 comprises a planar circular disc of diameter $\phi=62$ mm and thickness $t_1$ which is typically 0.5 mm to 3 mm. In other embodiments the substrate can comprise other geometries such as being convex or concave in form such as for example being dome shaped or cylindrical.

The diffusing layer 44 comprises a uniform thickness layer of particles of a light diffractive material, preferably titanium dioxide ($TiO_2$). In alternative arrangements the light diffractive material can comprise barium sulfate ($BaSO_4$), magnesium oxide (MgO), silicon dioxide ($SiO_2$), aluminum oxide ($Al_2O_3$) or a powdered material with as high a reflectivity as possible, typically a reflectance of 0.9 or higher. The light diffractive material powder is thoroughly mixed in known proportions with a light transmissive liquid binder material to form a suspension and the resulting mixture deposited onto the face of the substrate 42 preferably by screen printing to form a uniform layer of thickness $t_2$ (typically in a range 10 µm to 75 µm) that covers the entire face of the substrate. The quantity of light diffracting material per unit area in the light diffusing layer 44 will typically in a range 10 $\mu g \cdot cm^{-2}$ to 5 $mg \cdot cm^{-2}$.

Whilst screen printing is a preferred method for depositing the light diffractive diffusing layer 44, it can be deposited using other techniques such as for example slot die coating, spin coating, roller coating, drawdown coating or doctor blading. The binder material can comprise a curable liquid polymer such as a polymer resin, a monomer resin, an acrylic, an epoxy (polyepoxide), a silicone or a fluorinated polymer. It is important that the binder material is, in its cured state, substantially transmissive to all wavelengths of light generated by the phosphor material(s) and the LEDs 24 and preferably has a transmittance of at least 0.9 over the visible spectrum (380 nm to 800 nm). The binder material is preferably U.V. curable though it can be thermally curable, solvent based or a combination thereof. U.V. or thermally curable binders can be preferable because, unlike solvent-based materials, they do not "outgas" during polymerization. In one arrangement the average particle size of the light diffractive material is in a range 5 µm to 15 µm though as will be described it can be in a nanometer range (nm) and is advantageously in a range 100 nm to 150 nm. The weight percent loading of light diffractive material to liquid binder is typically in a range 7% to 35%.

The wavelength conversion layer 46 is deposited in direct contact with the light diffusing layer 44 without any intervening layers or air gaps. The phosphor material, which is in powder form, is thoroughly mixed in known proportions with a liquid light transmissive binder material to form a suspension and the resulting phosphor composition, "phosphor ink", deposited directly onto the diffusing layer 44. The wavelength conversion layer is preferably deposited by screen printing though other deposition techniques such as slot die coating, spin coating or doctor blading can be used. To eliminate an optical interface between the wavelength conversion and diffusing layers 46, 44 and to maximize the transmission of light between layers, the same liquid binder material is preferably used to fabricate both layers; that is, a polymer resin, a monomer resin, an acrylic, an epoxy, a silicone or a fluorinated polymer.

The phosphor wavelength conversion layer 46 is preferably deposited by screen printing though other deposition techniques such as for example slot die coating, spin coating, roller coating, drawdown coating or doctor blading can be used. The binder material is preferably U.V. or thermally curable rather than being solvent-based. When a solvent evaporates the volume and viscosity of the composition will change and this can result in a higher concentration of phosphor material which will affect the emission product color of the device. With U.V. curable polymers, the viscosity and solids ratios are more stable during the deposition process with U.V. curing being used to polymerize and solidify the layer after deposition is completed. Moreover since in the case of screen printing of the phosphor ink multiple-pass printing may be required to achieve a required layer thickness, the use of a U.V. curable binder is preferred since each layer can be cured virtually immediately after printing prior to printing of the next layer.

The color of the emission product produced by the wavelength conversion component depends on the phosphor material composition and the quantity of phosphor material per unit area in the wavelength conversion layer 46. It will be appreciated that the quantity of phosphor material per unit area is dependent on the thickness $t_3$ of the wavelength conversion layer 46 and the weight loading of phosphor material to binder in the phosphor ink. In applications in which the emission product is white or in applications in which the emission product has a high saturation color (i.e. the emission product comprises substantially all photoluminescence generated light) the quantity of phosphor material per unit area in the wavelength conversion layer 46 will typically be between 10 mg·cm$^{-2}$ and 40 mg·cm$^{-2}$. To enable printing of the wavelength conversion layer 46 in a minimum number of print passes the phosphor ink preferably has as high a solids loading of phosphor material to binder material as possible and preferably has a weight loading of phosphor material to binder in a range 40% to 75%. For weight loadings below about 40% it is found that five or more print passes may be necessary to achieve a required phosphor material per unit area. The phosphor material comprises particles with an average particle size of 10 μm to 20 μm and typically of order 15 μm.

In general lighting applications the emission product 40 will typically be white light and the phosphor material can comprise one or more blue light excitable phosphor materials that emit green (510 nm to 550 nm), yellow-green (550 nm to 570 nm), yellow (570 nm to 590 nm), orange (590 nm to 630 nm) or red (630 nm to 740 nm) light. The thickness $t_3$ of the wavelength conversion layer, phosphor material composition and the density (weight loading) of phosphor material per unit area will determine the color of light emitted by the lamp.

The phosphor material can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 B2 "Silicate-based green phosphors", U.S. Pat. No. 7,601,276 B2 "Two phase silicate-based yellow phosphors", U.S. Pat. No. 7,655,156 B2 "Silicate-based orange phosphors" and U.S. Pat. No. 7,311,858 B2 "Silicate-based yellow-green phosphors". The phosphor can also comprise an aluminate-based material such as is taught in co-pending patent application US2006/0158090 A1 "Novel aluminate-based green phosphors" and U.S. Pat. No. 7,390,437 B2 "Aluminate-based blue phosphors", an aluminum-silicate phosphor as taught in co-pending application US2008/0111472 A1 "Aluminum-silicate orange-red phosphor" or a nitride-based red phosphor material such as is taught in co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can comprise any phosphor material including nitride and/or sulfate phosphor materials, oxy-nitrides and oxy-sulfate phosphors or garnet materials (YAG).

Figure 3:
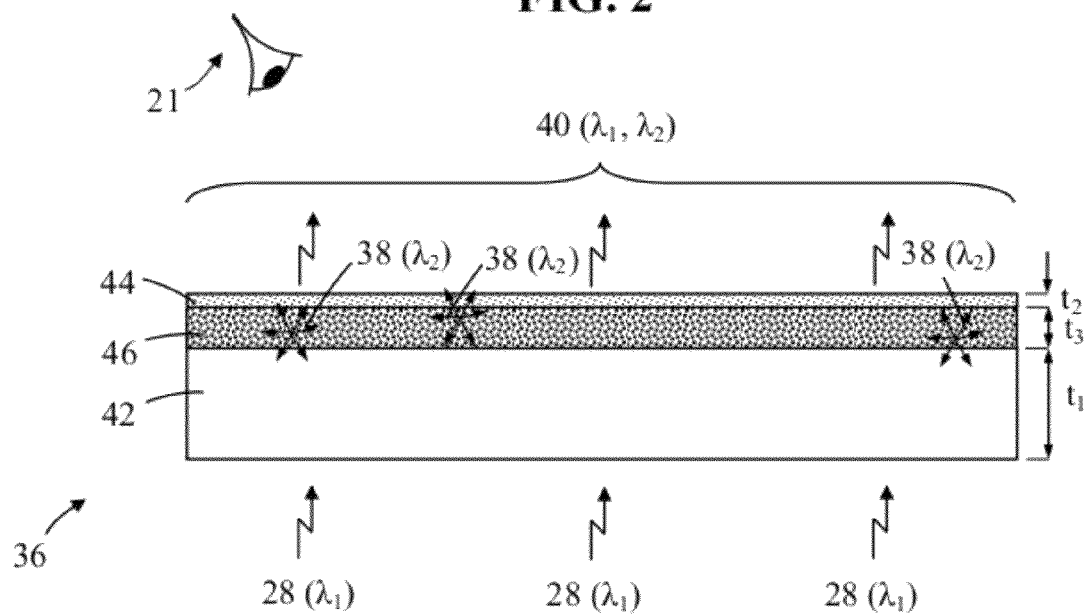
FIG. 3 is a schematic of a phosphor wavelength conversion component in accordance with another embodiment of the invention.

A further example of a phosphor wavelength conversion component 36 in accordance with the invention is illustrated in FIG. 3. In common with the wavelength conversion component of FIG. 2 the component comprises a light transmissive substrate 42, a light diffusing layer 44 and a wavelength conversion layer 46. In accordance with the invention the light diffusing and wavelength conversion layers 44, 46 are deposited in direct contact with one another. Again in operation the component is configured such that the wavelength conversion component is configured such that the light diffusing layer 44 faces the LEDs 24.

In operation blue light 28 generated by the LEDs 24 travels through the wavelength conversion layer 46 until it strikes a particle of phosphor material. It is believed that on average as little as 1 in 1000 interactions of a photon with a phosphor material particle results in absorption and generation of photo luminescence light 38. The majority, about 99.9%, of interactions of photons with a phosphor particle result in scattering of the photon. Due to the isotropic nature of the scattering process on average half of the photons will scattered in a direction back towards the LEDs. Tests indicate that typically about 10% of the total incident blue light 28 is scattered and emitted from the wavelength conversion component 36 in a direction back towards the LEDs. For a cool white light emitting device the amount of phosphor material is selected to allow approximately 10% of the total incident blue light to be emitted from the wavelength conversion component and contribute to the emission product 40 that is viewed by an observer 21. The majority, approximately 80%, of the incident light is absorbed by the phosphor material and re-emitted as photo luminescence light 38. Due to the isotropic nature of photo luminescence light generation, approximately half of the light 38 generated by the phosphor material will be emitted in a direction towards the LED. As a result only up to about 40% of the total incident light will be emitted as light 38 of wavelength $\lambda_2$ and contributes to the emission product 38 with the remaining (up to about 40%) of the total incident light being emitted as light 38 of wavelength $\lambda_2$ in a direction back towards the LED. Light emitted towards the LEDs from the wavelength conversion component 36 is re-directed by the light diffractive surfaces 32, 34 to contribute to the emission product and to increase the overall efficiency of the device.

One problem associated with a conventional LED lighting device that is addressed by embodiments of the invention is the non-white color appearance of the device in an OFF state. As discussed, during an ON state, the LED chip or die generates blue light and some portion of the blue light is thereafter absorbed by the phosphor(s) to re-emit yellow light (or a combination of green and red light, green and yellow light, green and orange or yellow and red light). The portion of the blue light generated by the LED that is not absorbed by the phosphor combined with the light emitted by the phosphor provides light which appears to the human eye as being nearly white in color.

However, in an OFF state, the LED chip or die does not generate any blue light. Instead, light that is produced by the remote phosphor lighting apparatus is based at least in part upon external light (e.g., sunlight or room lights) that excites the phosphor material in the wavelength conversion component, and which therefore generates a yellowish, yellow-orange or orange color in the photoluminescence light. Since the LED chip or die is not generating any blue light, this means that there will not be any residual blue light to combine with the yellow/orange light from the photoluminescence light of the wavelength conversion component to generate white appearing light. As a result, the lighting device will appear to be yellowish, yellow-orange or orange in color. This may be undesirable to the potential purchaser or customer that is seeking a white-appearing light.

According to some embodiments, the light diffusing layer 44 provides the additional benefit of addressing this problem by improving the visual appearance of the device in an OFF state to an observer 21. In part, this is because the light diffusing layer 44 includes particles of a light diffractive material that can substantially reduce the passage of external excitation light that would otherwise cause the wavelength conversion component to re-emit light of a wavelength having a yellowish/orange color.

The particles of a light diffractive material in the light diffusing layer 44 are selected, for example, to have a size range that increases its probability of scattering blue light, which means that less of the external blue light passes through the light diffusing layer 44 to excite the wavelength conversion layer 46. Therefore, the remote phosphor lighting apparatus will have more of a white appearance in an OFF state since the wavelength conversion component is emitting less yellow/red light.

The light diffractive particle size can be selected such that the particles will scatter blue light relatively at least twice as much as they will scatter light generated by the phosphor material. Such a light diffusing layer 44 ensures that during an OFF state, a higher proportion of the external blue light received by the device will be scattered and directed by the light diffractive material away from the wavelength conversion layer 46, decreasing the probability of externally originated photons interacting with a phosphor material particle and minimizing the generation of the yellowish/orange photoluminescent light. However, during an ON state, phosphor generated light caused by excitation light from the LED light source can nevertheless pass through the diffusing layer 44 with a lower probability of being scattered. Preferably, to enhance the white appearance of the lighting device in an OFF state, the light diffractive material within the light diffusing layer 44 is a "nano-particle" having an average particle size of less than about 150 nm. For light sources that emit lights having other colors, the nano-particle may correspond to other average sizes. For example, the light diffractive material within the light diffusing layer 44 for an UV light source may have an average particle size of less than about 100 nm.

Figure 10:
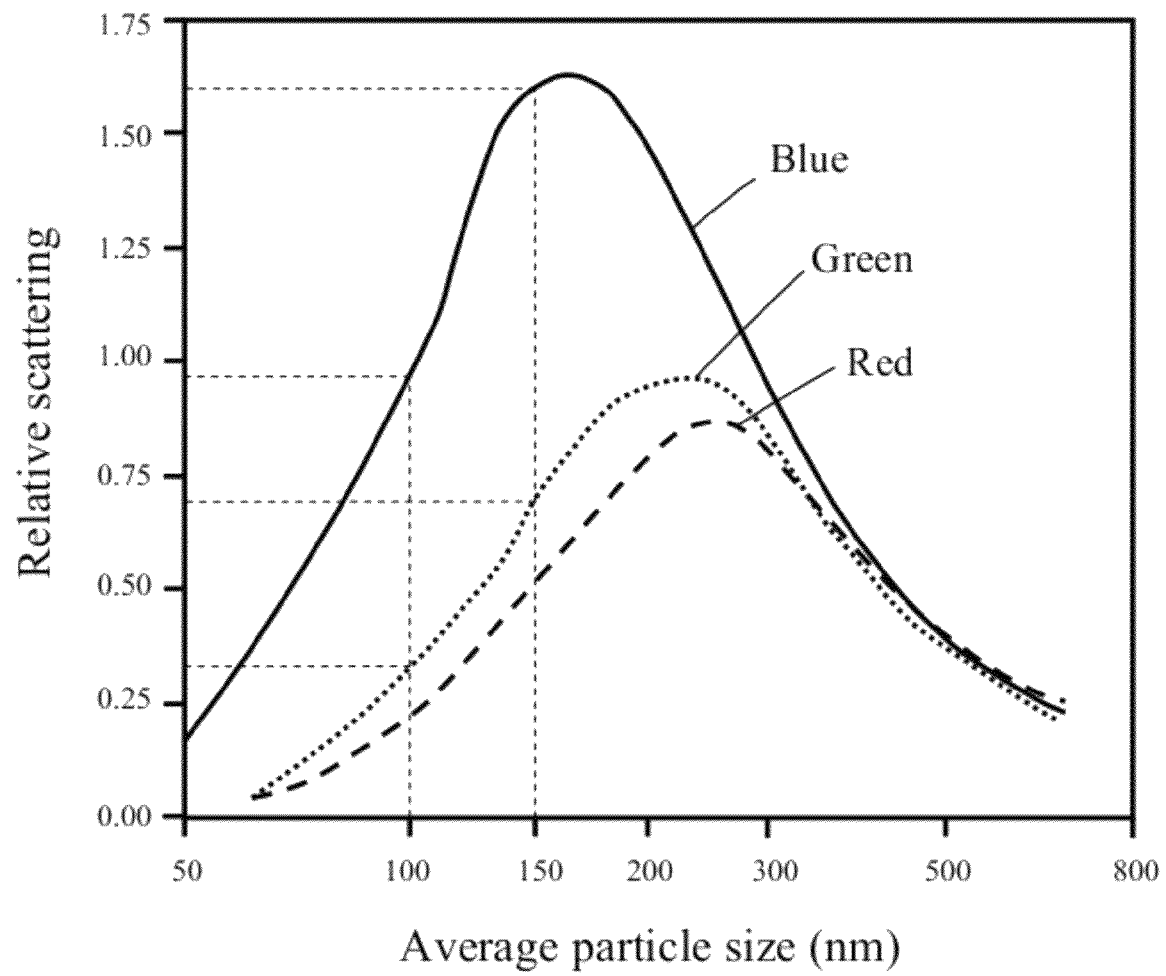
FIG. 10 shows plots of relative light scattering versus light diffractive particle size (nm) for red, green and blue light.

Therefore, by appropriate selection of the average particle size of the light scattering material, it is possible to configure the light diffusing layer such that it scatters excitation light (e.g., blue light) more readily than other colors, namely green and red as emitted by the photoluminescence materials. FIG. 10 shows plots of relative light scattering versus $TiO_2$ average particle size (nm) for red, green and blue light. As can be seen from FIG. 10, $TiO_2$ particles with an average particle size of 100 nm to 150 nm are more than twice as likely to scatter blue light (450 nm to 480 nm) than they will scatter green light (510 nm to 550 nm) or red light (630 nm to 740 nm). For example $TiO_2$ particles with an average particle size of 100 nm will scatter blue light nearly three times (2.9=0.97/0.33) more than it will scatter green or red light. For $TiO_2$ particles with an average particle size of 200 nm these will scatter blue light over twice (2.3=1.6/0.7) as much as they will scatter green or red light. In accordance with some embodiments of the invention, the light diffractive particle size is preferably selected such that the particles will scatter blue light relatively at least twice as much as light generated by the phosphor material(s).

Another problem with remote phosphor devices that can be addressed by embodiments of the invention is the variation in color of emitted light with emission angle. In particular, remote phosphor devices are often subject to perceptible non-uniformity in color when viewed from different angles.

Figure 4:
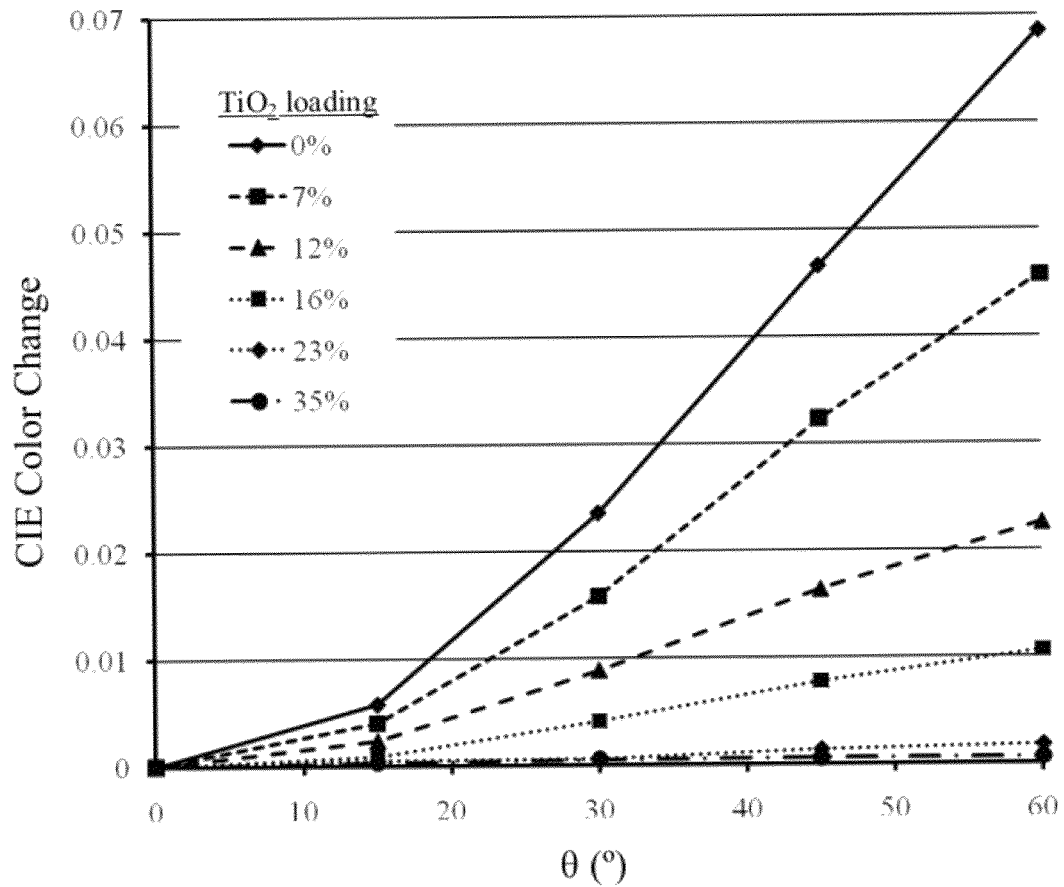
FIG. 4 shows plots of emission color change versus emission angle for the device of FIG. 1 for phosphor wavelength conversion components containing 0%, 7%, 12%, 16%, 23% and 35% weight loadings of light diffractive material.

Embodiments of the invention correct for this problem, since the addition of a light diffusing layer 44 in direct contact with the wavelength conversion layer 46 significantly increases the uniformity of color of emitted light with emission angle θ. The emission angle θ is measured with respect to an emission axis 48 (FIG. 1). FIG. 4 shows plots of measured CIE color change versus emission angle θ for the lamp of FIG. 1 for wavelength conversion components 36 comprising diffusing layer 44 with percentage (%) weight loadings of light diffractive material to binder material of 0%, 7%, 12%, 16%, 23% and 35%, according to some example implementations of the invention. All emission color measurements were measured at a distance of 10 m from the lamp 10 for wavelength conversion components in which the light diffusing layer comprises light diffractive particles of $TiO_2$ with an average particle size ≈5 μm For comparison the data for a 0% percentage loading of $TiO_2$ correspond to a wavelength conversion component that does not include a light diffusing layer.

The measured color change is derived from the relationship:

$$\text{CIE change} = \sqrt{(CIEx_\theta° - CIEx_0°)^2 + (CIEy_\theta° - CIEy_0°)^2}$$

where CIE $x_\theta°$ is the measured CIE chromaticity x value at an emission angle of θ°, CIE $x_0°$ is the measured CIE chromaticity x value for an emission angle of θ=0°, CIE $y_\theta°$ is the measured CIE chromaticity y value at an emission angle of θ° and CIE $y_0°$ is the measured CIE chromaticity y value at an emission angle of θ=0°. It will be appreciated that the CIE change is normalized to the light color at an emission angle θ=0° (i.e. the CIE change is always 0 for θ=0°.

As can be seen in FIG. 4 for a wavelength conversion component with no light diffusing layer (i.e. 0% $TiO_2$ loading), the color of light generated by such a lamp can alter by a CIE change of nearly 0.07 for emission angles up to θ=60°. In comparison for a wavelength conversion component 36 in accordance with the invention that includes a light diffusing layer 44 with a percentage weight loading of $TiO_2$ of only 7% the change in emission color over a 60° range drops to about 0.045. As can be seen from this figure, increasing the percentage weight loading of $TiO_2$ decreases the change in emission color over a 60° angular range. For example for a 35% $TiO_2$ percentage weight loading the CIE color change is less than 0.001. Although the change in emission color with emission angle decreases with increasing $TiO_2$ loading the total emission intensity will also decrease.

Figure 5:
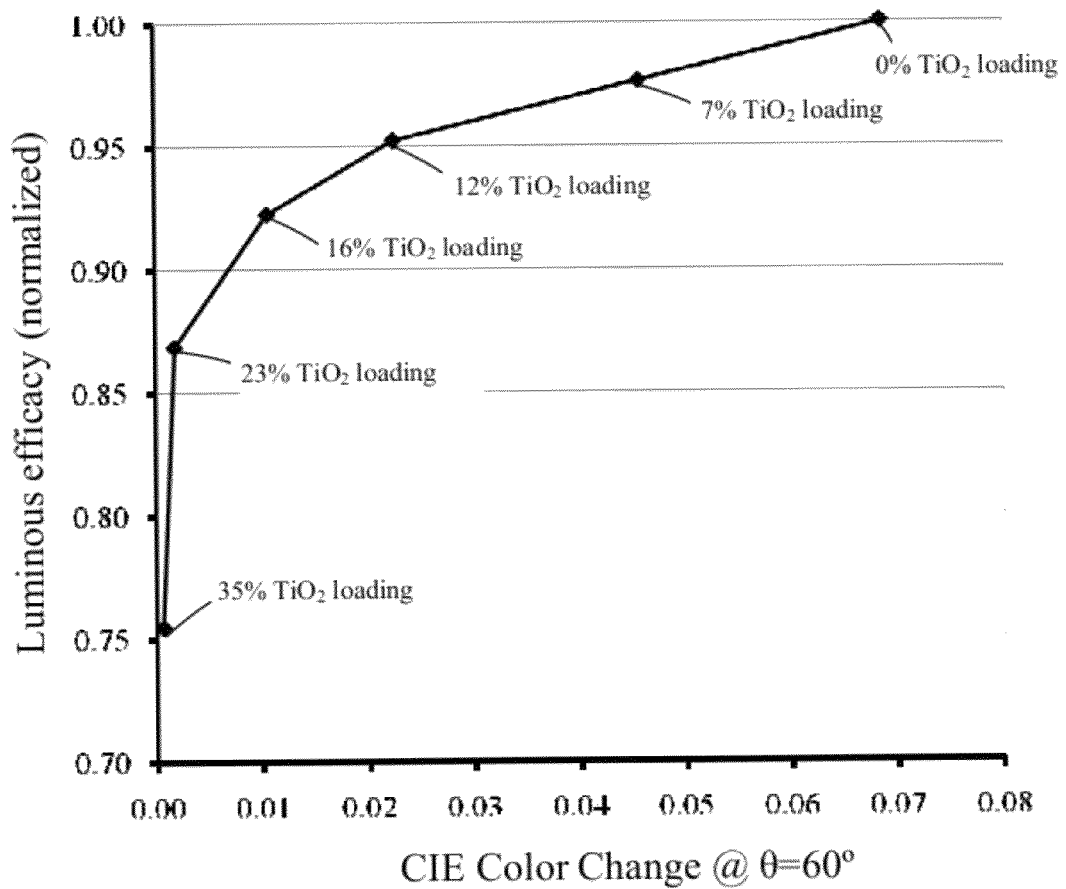
FIG. 5 is a plot of luminous efficacy (normalized) versus emission color change at an emission angle θ=60° for the device of FIG. 1.

FIG. 5 shows measured luminous efficacy versus CIE color change at an emission angle θ=60° for wavelength conversion components 36 comprising diffusing layer 44 with percentage (%) weight loadings of $TiO_2$ to binder material of 0%, 7%, 12%, 16%, 23% and 35% for an example implementation of the invention. The luminous efficacy values are normalized relative to a lamp that does not include a light diffusing layer (i.e. 0% $TiO_2$ loading). The CIE color change @ $\theta=60°$ is determined from the relationship:

$$\sqrt{(CIEx_{60}°-CIEx_0°)^2+(CIEy_{60}°-CIEy_0°)^2}$$

where CIE $x_{60}°$ is the measured CIE chromaticity x value at an emission angle of 60°, CIE $x_0°$ is the measured CIE chromaticity x value for an emission angle of 0°, CIE $y_{60}°$ is the measured CIE chromaticity y value at an emission angle of 60° and CIE $y_0°$ is the measured CIE chromaticity y value at an emission angle of 0°. As can be seen from FIG. 5, there can be as much as a 25% decrease in luminous efficacy for a wavelength conversion component with a light diffusing layer containing a 35% weight loading of $TiO_2$. It will be appreciated when selecting the weight loading of light diffractive material in light diffusing layer a balance should be struck between improving emission color uniformity with emission angle and the decrease in luminous efficacy of the lamp. Wavelength conversion component in accordance with some embodiments of the invention preferably has a light diffusing layer with percentage weight loading of light diffractive material to binder material in a range 10% to 20%.

Figure 6:
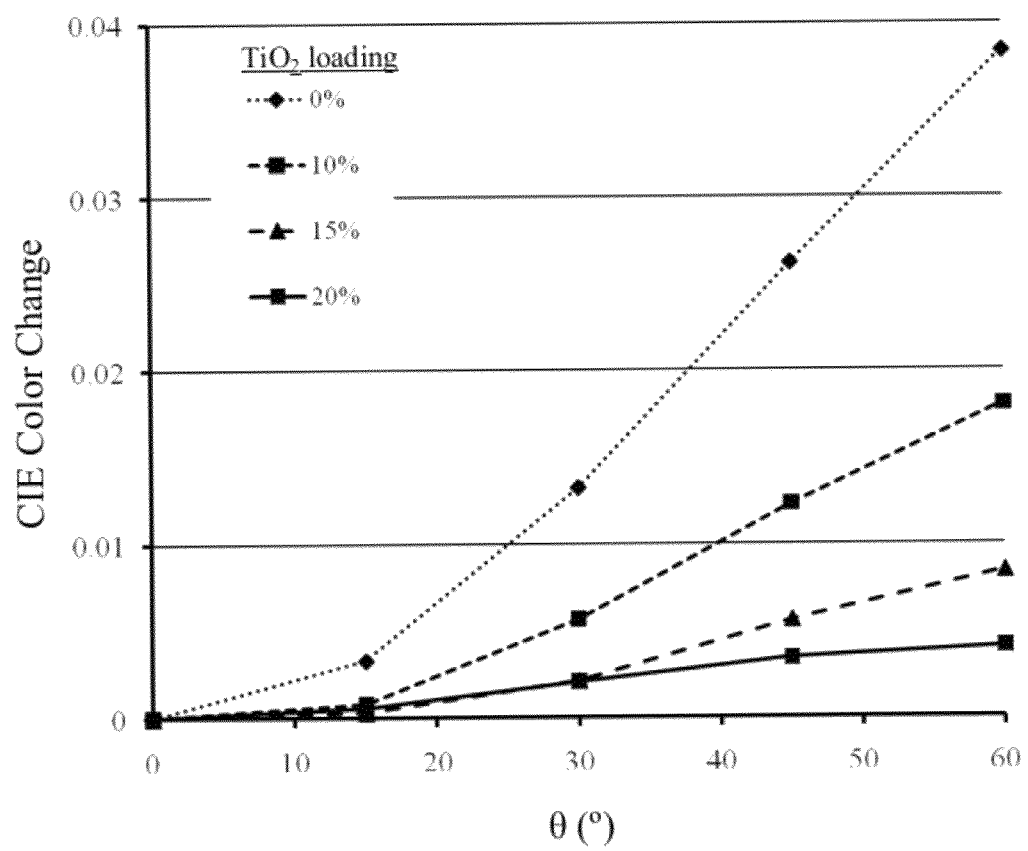
FIG. 6 shows plots of emission color change versus emission angle for a warm white (≈3000K) solid-state light emitting device in accordance with the invention for wavelength conversion components containing different 0%, 10%, 15% and 20% weight loadings of light diffractive material.
Figure 7:
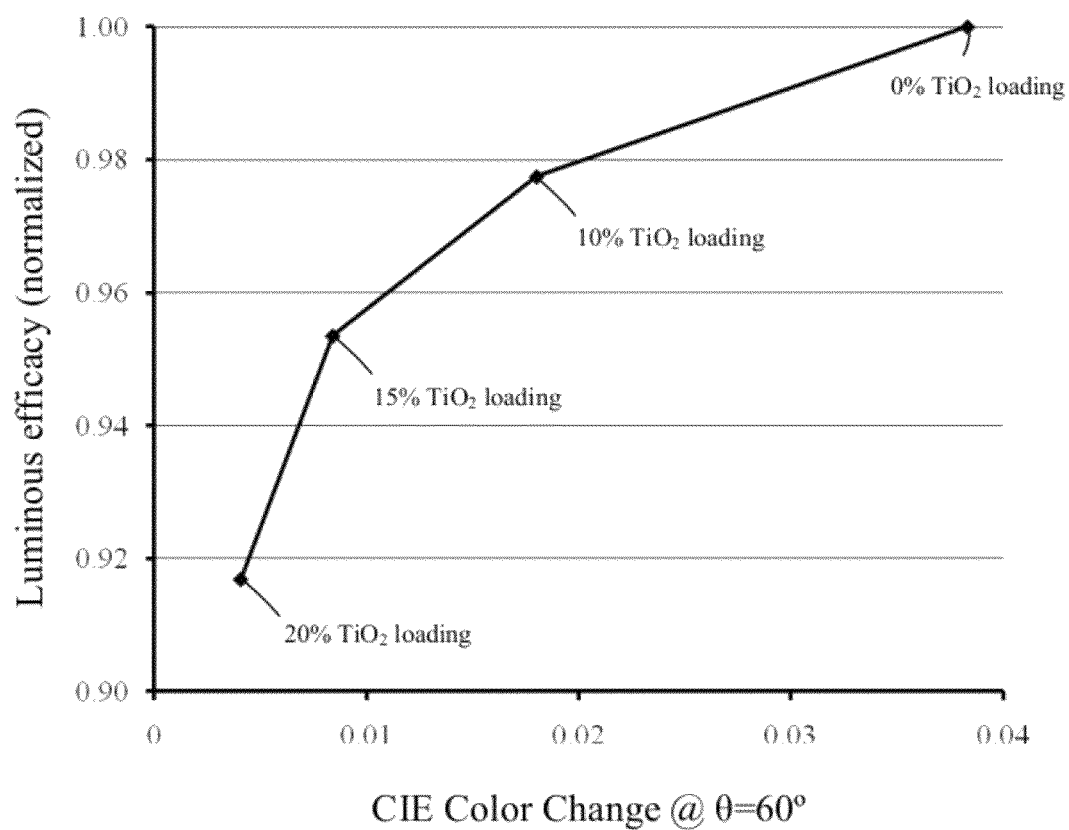
FIG. 7 is a plot of luminous efficacy (normalized) versus emission color change at an emission angle θ=60° for the warm white light emitting device for wavelength conversion components containing different 0%, 10%, 15% and 20% weight loadings of light diffractive material.

FIG. 6 shows plots of measured CIE color change versus emission angle θ for an example implementation of a 3000K white light emitting lamp 10 for conversion components 36 comprising diffusing layer 44 with percentage (%) weight loadings of $TiO_2$ to binder material of 0%, 10%, 15% and 20% whilst FIG. 7 shows corresponding measured luminous efficacy versus CIE color change at an emission angle θ=60°.

Figure 8:
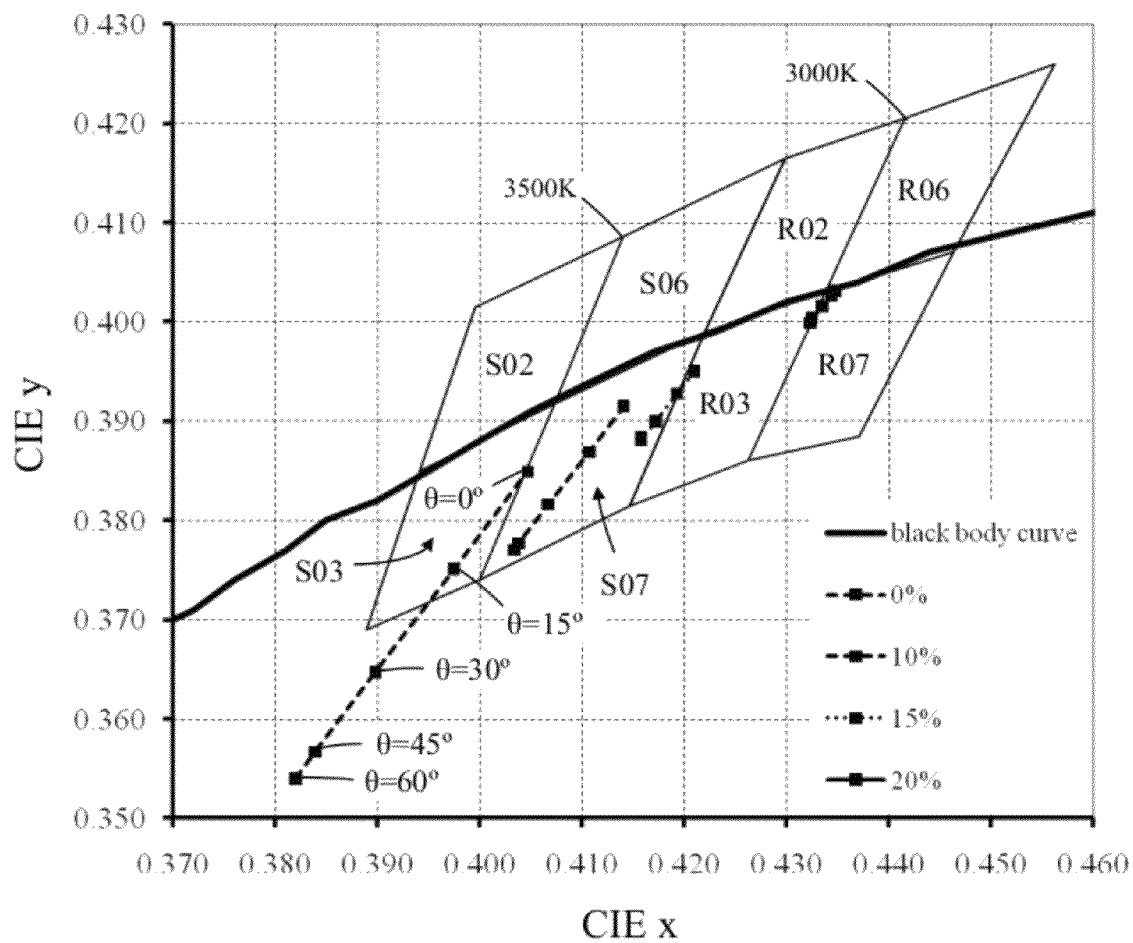
FIG. 8 is a 1931 C.I.E. (Commission Internationale de l'Eclairage) chromaticity diagram showing emission color at emission angles θ=0°, 15°, 30°, 45° and 60° for the warm white light emitting device for wavelength conversion components containing 0%, 10%, 15% and 20% weight loadings of light diffractive material.

FIG. 8 is a 1931 chromaticity diagram showing the color CIE x, CIE y) of emitted light at emission angles θ=0°, 15°, 30°, 45° and 60° for a an example 3000K white light emitting LED-based lamp in accordance with the invention for wavelength conversion components containing 0%, 10%, 15% and 20% weight loadings of $TiO_2$. For comparison FIG. 8 also includes the black body radiation curve and ANSI C78.377A "*Specification for chromaticity of white solid state lighting products*" S and R quadrangles for white light of 3500K and 3000K respectively. Each quadrangle is equivalent to approximately seven MacAdam ellipses whilst each sub quadrangle (S02, S03, S06, S07, R02, R03, R06, R07) is equivalent to approximately four McAdam ellipses. As is known a MacAdam ellipse is a region on a chromaticity diagram which contains all colors which are indistinguishable, to the average human eye 21, from the color at the center of the ellipse. As can be seen from FIG. 8 for a lamp without a light diffusing layer (0% $TiO_2$), the variation in emission color for emission angles of over a range θ=0° to 60° is approximately three MacAdam ellipses. For a lamp including a light diffusing layer with a 10% weight loading of $TiO_2$, the variation in emission color with emission angle is less than two MacAdam ellipses with a corresponding decrease in luminous efficacy of about 2% (FIG. 7). For a lamp including a light diffusing layer with a 15% weight loading of $TiO_2$, the variation in emission color with emission angle is approximately one MacAdam ellipse with a corresponding decrease in luminous efficacy of about 5% (FIG. 7). For such a lamp, an average person 21 would be unable to perceive the variation in emission color with emission angle. For a lamp including a light diffusing layer with a 20% weight loading of $TiO_2$ the variation in emission color with emission angle is less than one MacAdam ellipse with a corresponding decrease in luminous efficacy of about 9% (FIG. 7). It will be appreciated the inclusion of a light diffusing layer 44 in accordance with the invention can virtually eliminate the effects of emission color variation with emission angle whilst maintaining an acceptable luminous efficacy.

Embodiments of the present invention can also be used to reduce the amount of phosphor materials that is required to manufacture an LED lighting product, thereby reducing the cost of manufacturing such products given the relatively costly nature of the phosphor materials. In particular, the addition of a light diffusing layer 44 composed of particles of a light diffractive material can substantially reduce the quantity of phosphor material required to generate a selected color of emitted light. This means that relatively less phosphor is required to manufacture a wavelength conversion component as compared to comparable prior art approaches. As a result, it will be much less costly to manufacture lighting apparatuses that employ such wavelength conversion components, particularly for remote phosphor lighting devices.

In operation, the diffusing layer 44 increases the probability that a photon will result in the generation of photoluminescence light by reflecting light back into the wavelength conversion layer 46. Therefore, inclusion of a diffusing layer with the wavelength conversion layer can reduce the quantity of phosphor material required to generate a given color emission product, e.g., by up to 40%.

As previously noted, the light diffusing layer 44 can be configured such that it selectively scatters excitation light generated by the LEDs (e.g., blue light) more than it scatters light generated by the phosphor material. Such a light diffusing layer 44 ensures that a higher proportion of the blue light emitted from the wavelength conversion layer will be scattered and directed by the light diffractive material back into the wavelength conversion layer increasing the probability of the photon interacting with a phosphor material particle and resulting in the generation of photoluminescence light. At the same time phosphor generated light can pass through the diffusing layer with a lower probability of being scattered. Since the diffusing layer increases the probability of blue photons interacting with a phosphor material particle less phosphor material can be used to generate a selected emission color. Such an arrangement can also increase luminous efficacy of the wavelength conversion component/device.

The light diffusing layer 44 can be used in combination with additional scattering (or reflective/diffractive) particles in the wavelength conversion component to further reduce the amount of phosphor material that is required to generate a selected color of emitted light. As disclosed in U.S. application Ser. No. 13/253,031 (which is hereby incorporated by reference in its entirety), a wavelength conversion component comprises particles of a light scattering material (also referred to herein as "light reflecting material") that is incorporated with the phosphor material to enhance photoluminescence light generation by the phosphor material. The enhanced light generation results from the light reflective material increasing the number of collisions of light generated by the light emitter(s) with particles of the phosphor material. The net result is a decrease in phosphor material usage for the light emitting devices.

Figure 11:
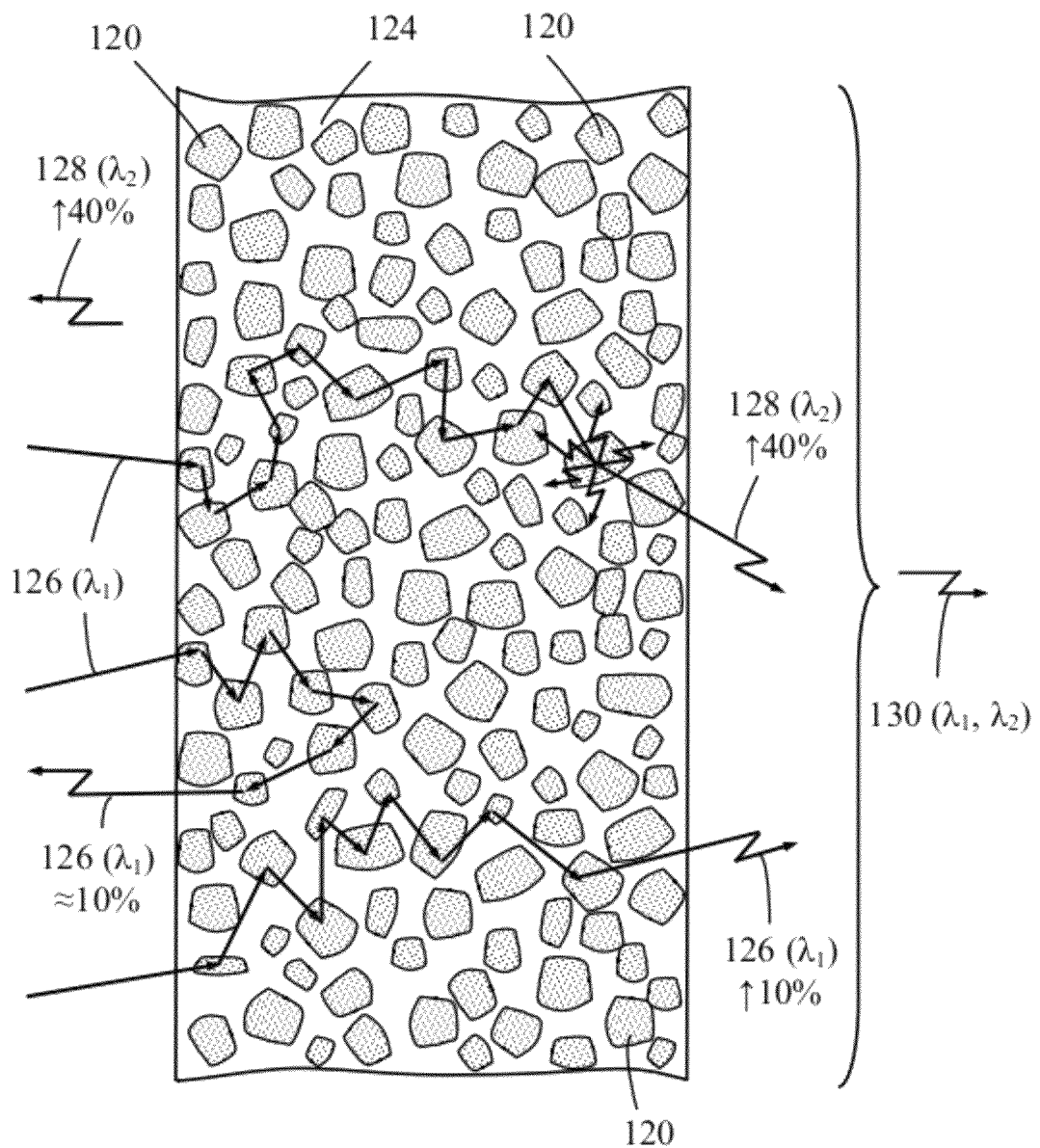
FIG. 11 is a schematic illustrating the principle of operation of a known light emitting device.

To explain this aspect of the current embodiment, it is helpful to first provide an explanation of the prior art approach that does not mix phosphors with scattering particles. FIG. 11 shows a schematic of an LED-based light emitting device that utilizes phosphor wavelength conversion without scattering particles mixed in with phosphors. The known device of FIG. 11 includes a wavelength conversion component that includes phosphor material particles 120 homogeneously distributed throughout the volume of a light transmissive binder 124. Unlike the device of the invention, the known devices do not include particles of a light scattering material. In operation blue light 126 from the LED is transmitted by the light transmissive binder 124 until it strikes a particle of phosphor material. It is believed that on average as little as 1 in a 10,000 interactions of a photon with a phosphor material particle results in absorption and generation of photoluminescence light. The majority, about 99.99%, of interactions of photons with a phosphor particle result in scattering of the photon. Due to the isotropic nature of the scattering process on average half the scattered photons will be in a direction back towards the LED. Tests indicate that typically about 10% of the total incident blue light is scattered and emitted from the wavelength conversion component in a direction back towards the LED. For a cool white light emitting device the amount of phosphor material is selected to allow approximately 10% of the total incident blue light to be emitted through the window and contribute to the emission product. The majority, approximately 80%, of the incident light is absorbed by the phosphor material and re-emitted as photoluminescence light 128. Due to the isotropic nature of photoluminescence light generation, approximately half of the light 128 generated by the phosphor material will be emitted in a direction towards the LED. As a result up to (↑) 40% of the total incident light will be emitted as light 128 of wavelength $\lambda_2$ and contributes to the emission product 130 whilst up to (↑) 40% of the total incident light will be emitted as light 128 of wavelength $\lambda_2$ in a direction back towards the LED. Typically light that is emitted towards the LED is re-directed by a reflector (not shown) to increase the overall efficacy of the device.

Figure 12:
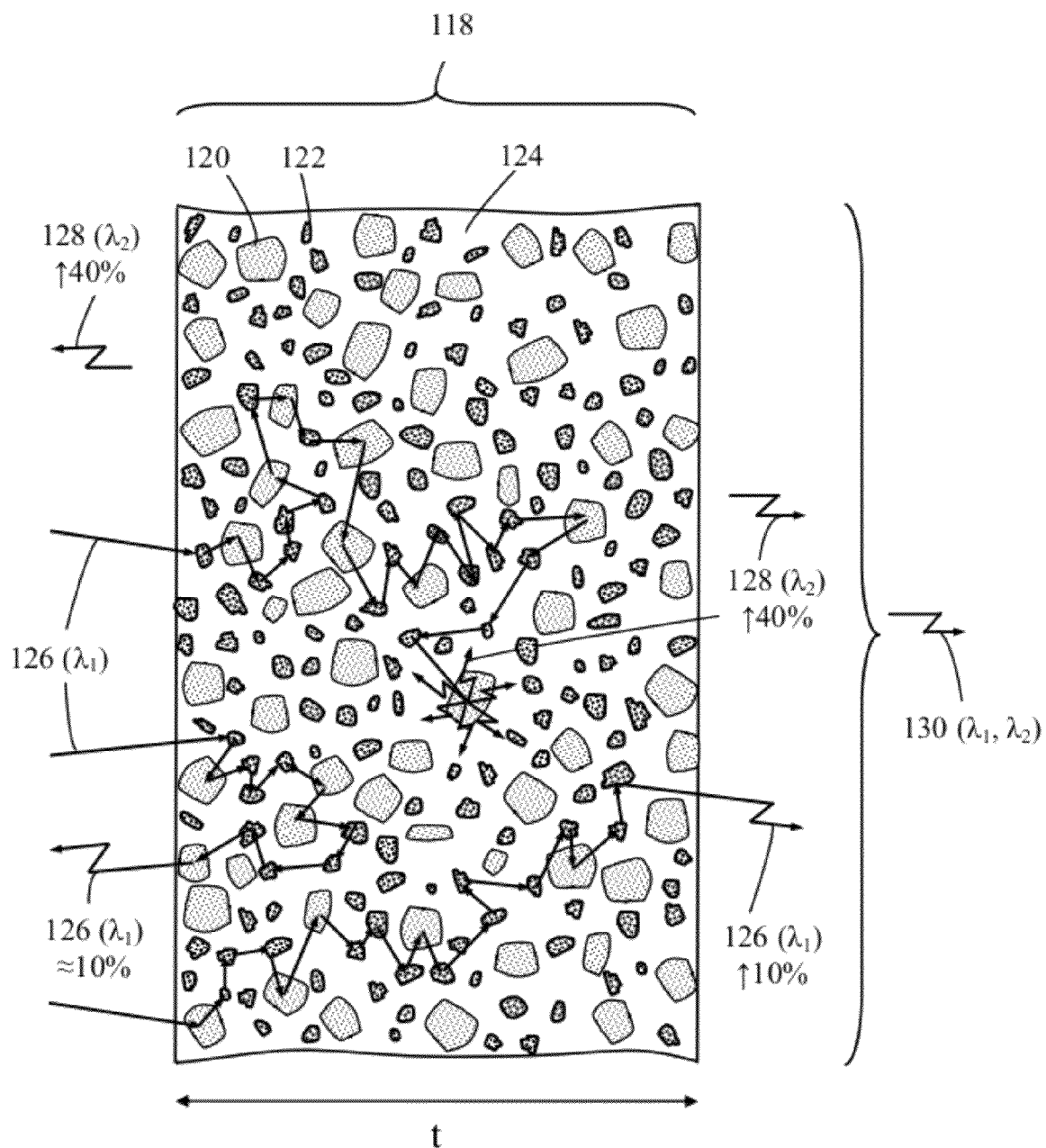
FIG. 12 is a schematic illustrating the principle of operation of the light emitting device having scattering particles mixed with phosphor particles in accordance with an embodiment of the invention.

FIG. 12 shows a schematic of operation of a device that is similar to that of FIG. 11 but additionally includes reflection or scattering of light (of wavelengths $\lambda_1$ and $\lambda_2$) by the particles of the light reflective/scattering material. By including particles of a light reflective material with the phosphor material, this can reduce the amount of phosphor material required to generate a given color emission product, e.g. by up to 33% in some embodiments. The particles of light reflective material increase the probability of photons striking a particle of phosphor material and thus for an emission product of a given color less phosphor material is required.

Figure 13:
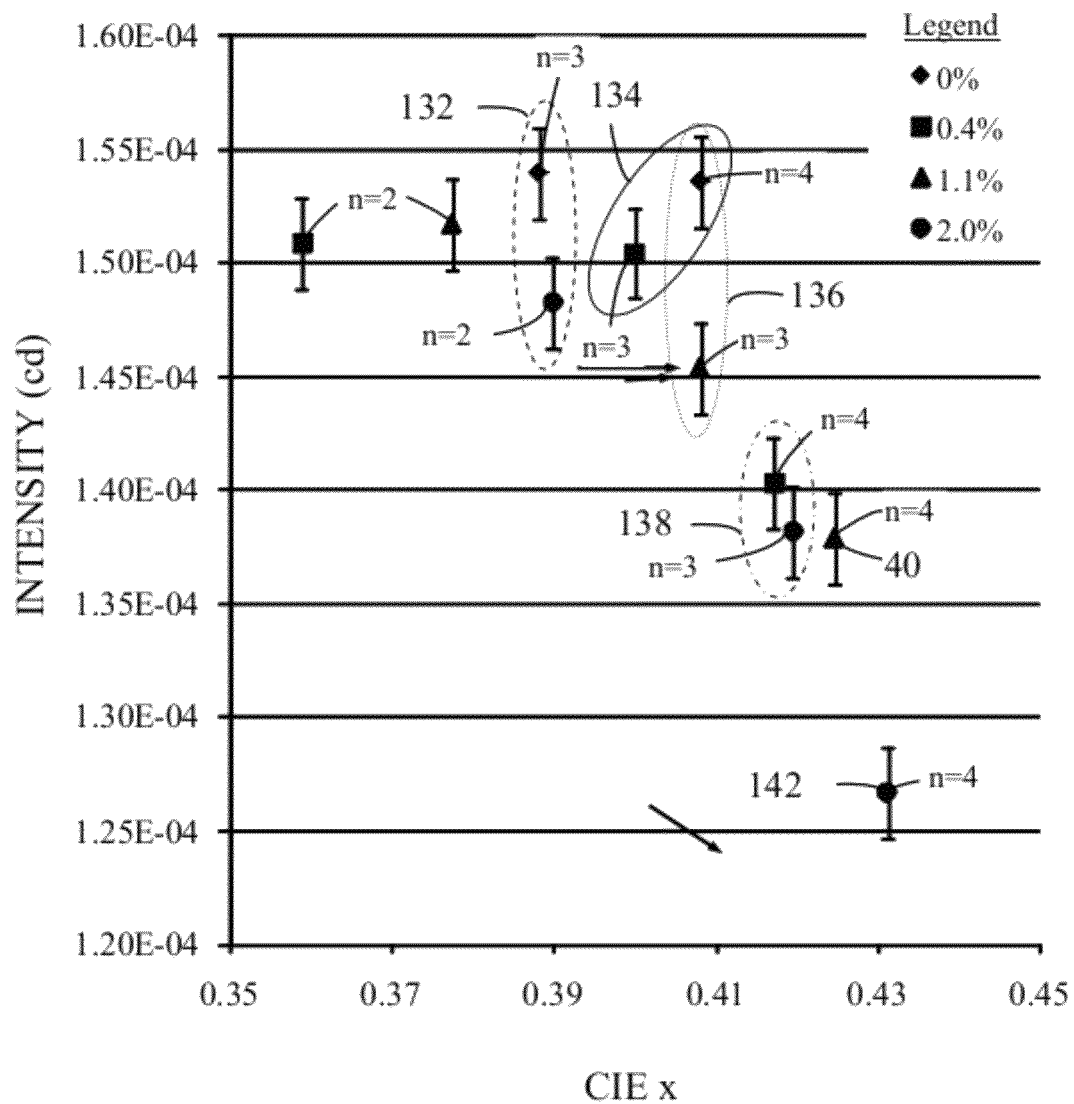
FIG. 13 is a plot of emission intensity versus chromaticity CIE x for an LED-based light emitting device in accordance with the invention for different weight percent loadings of light reflective material.

FIG. 13 is a plot of emission intensity versus chromaticity CIE x for a light emitting device in accordance with some embodiments of the invention for weight percent loadings of light reflective material of ♦—0%, ■—0.4%, ▲—1.1% and ●—2%. The data are for screen printed phosphor conversion layers in which the binder material comprises Nazdar's® UV curable litho clear overprint PSLC-294 and the phosphor material comprises Internatix Corporation's phosphor EY4453 with an average particle size of 15 μm. The ratio of phosphor material to clear ink is in a proportion of 2:1 by weight. The light reflective material comprises Norcote International Inc's super white ink GN-027SA. The figures for loading of light reflective material refer to weight percent of super white ink to clear ink. The smaller reference numerals associated with each data point indicate the number 'n' of print passes used to form the phosphor layer.

The phosphor material and light scattering material, which can be in powder form, are thoroughly mixed in known proportions with the light transmissive binder material, such as a polymer material (for example a thermally or UV curable silicone or an epoxy material) or a clear ink such as for example Nazdar's® UV curable litho clear overprint PSLC-294. The mixture is applied to the face of a substrate as one or more layers of uniform thickness. In a preferred embodiment the mixture is applied to the light transmissive window by screen printing and the thickness t of the layer controlled by the number of printing passes. The phosphor/reflective material mixture can be applied using other methods including inkjet printing, spin coating or sweeping the mixture over the surface using a blade such as a squeegee (e.g. doctor blading).

It will be appreciated that the number of print passes is directly proportional to the thickness of the phosphor layer 118 and quantity of phosphor. The ovals 132, 134, 136, 138 are used to group data points for emission products that have substantially the same intensity and CIE x values. For example oval 132 indicates that an emission product of similar intensity and color can be produced for a phosphor conversion layers 118 comprising i) 3 print passes without light reflective material and ii) 2 print passes with a 2% loading of light reflective material. These data indicate that by the inclusion of a 2% weight loading of light reflective material it is possible to generate the same color and intensity of light using a phosphor conversion layer 118 that comprises about 33% less phosphor material. Oval 134 indicates that the same intensity and color of emission product is produced for a phosphor conversion layer comprising i) 4 print passes without light reflective material and ii) 3 print passes with a 0.4% loading of light reflective material. These data indicate that for this embodiment, by the inclusion of a 0.4% weight loading of light reflective material, the same color and intensity of light can be produced using a phosphor conversion layer comprising about 25% less phosphor. Oval 136 indicates that the same intensity and color of emission product is produced for a phosphor conversion layer comprising i) 4 print passes without light reflective material and ii) 3 print passes with a 1.1% loading of light reflective material. These data indicate that by the inclusion of a 1.1% weight loading of light reflective material the same color and intensity of light can be produced using a phosphor conversion layer comprising about 25% less phosphor. Oval 138 indicates that the same intensity and color of emission product is produced for a phosphor conversion layer comprising i) 4 print passes with a 0.4% weight loading of light reflective material and ii) 3 print passes with a 2% weight loading of light reflective material. These data indicate by the inclusion of a 0.4% weight loading of light reflective material that the same color and intensity of light can be produced using a phosphor conversion layer comprising about 25% less phosphor. Points 140 (n=4, 1.1% loading) and 142 (n=4, 2% loading) suggest that a saturation point exists above which an increase in light reflective material loading results in a decrease in emission intensity with little effect on the color.

It is envisioned in further embodiments to incorporate the mixture of phosphor and light reflective material mixture within a light transmissive window. For example the phosphor and light reflective material mixture can be mixed with a light transmissive polymer and the polymer/phosphor mixture extruded or injection molded to form the wavelength conversion component 36 with the phosphor and light reflective material homogeneously distributed throughout the volume of the component.

The light scattering material 122 comprises a powdered material with a high reflectivity typically a reflectance of 0.9 or higher. The particle size of the light reflective material is typically in a range 0.1 μm to 10 μm and in a preferred embodiment is within a range 0.1 μm to 10 μm. The weight percent loading of light reflective material to phosphor material is in a range 0.1% to 10% and in a preferred embodiment in a range 1% to 2%. Examples of light reflective materials include magnesium oxide (MgO), titanium dioxide ($TiO_2$), barium sulfate ($BaSO_4$) and combinations thereof. The light reflective material can also comprise a white ink such as for example Norcote International Inc's super white ink GN-027SA which already includes particles of a highly light reflective material, typically TiO$_2$.

Figure 14:
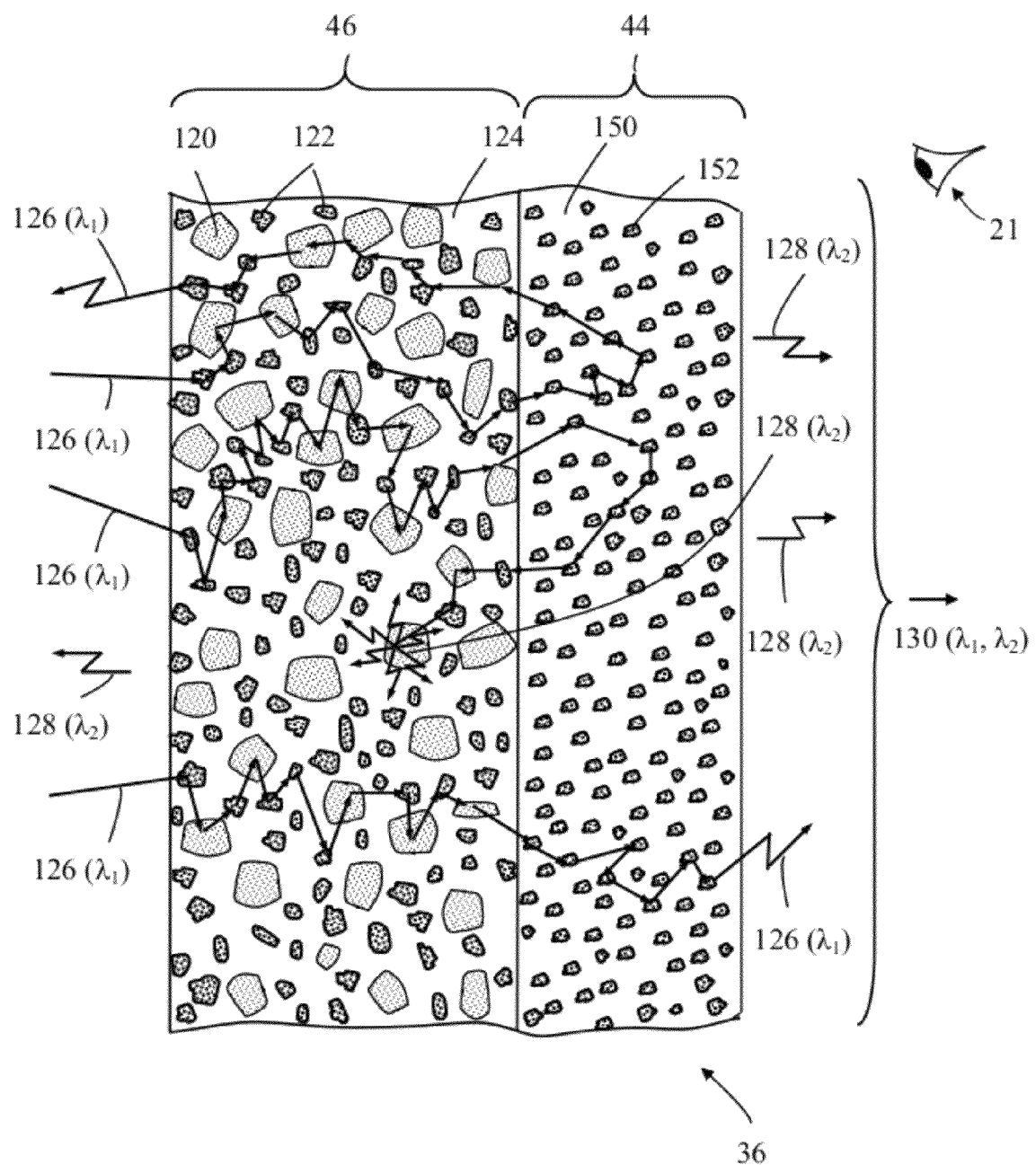
FIG. 14 is a schematic illustrating a light emitting device having scattering particles within both a wavelength conversion layer and a diffusing layer according to an embodiment of the invention.

FIG. 14 illustrates a representation of a LED-based white light emitting device in accordance with an embodiment of the invention, which includes a wavelength conversion component 36 having a wavelength conversion layer 46 that includes a mixture of phosphor material particles 120 and light scattering particles 122 distributed throughout the volume of a light transmissive binder material 124. The particles of light scattering particles 122 increase the probability of photons striking phosphor material particles 120, and thus for an emission product of a given color less phosphor material is required.

Wavelength conversion component 36 also includes a diffusing layer 44 that comprises light scattering particles 152 within a binder material 150. The light scattering particles 152 within the light diffusing layer 44 selectively scatters blue light 126 generated by the LEDs more than it scatters light 128 generated by the phosphor material 120. Such a light diffusing layer 44 ensures that a higher proportion of the blue light 126 emitted from the wavelength conversion layer 46 will be scattered and directed by the light scattering material 152 back into the wavelength conversion layer 46 increasing the probability of the photon interacting with a phosphor material particle 120 and resulting in the generation of photoluminescence light. At the same time phosphor generated light can pass through the diffusing layer 44 with a lower probability of being scattered. Since the diffusing layer 44 increases the probability of blue photons interacting with a phosphor material particle 120, less phosphor material can be used to generate an emitted light 130 of a selected emission color that is visible to an observer 21.

Therefore, the combination of a diffusing layer 44 having scattering particles 152 and a wavelength conversion layer 46 that also includes light scattering particles 122 results in a wavelength conversion component that requires much less phosphor materials 120 to generate a given color emission product. Both sets of scattering particles 122 and 152 act in combination to increase the probability of photons striking a particle of phosphor material 120, and thus require less phosphor material for a given color.

The two sets of scattering particles 122 and 152 can have different material properties. For example, the scattering particles 122 within the wavelength conversion layer 46 can be selected to have a relatively larger average particle size. On the other hand, the scattering particles 152 within the diffusing layer 44 can be selected to be nano-particles having a relatively smaller average particle size that is selected such that the particles 152 will scatter excitation (typically blue) light relatively more than they will scatter light generated by the photoluminescence (phosphor) material(s). Therefore, some embodiments employ a light scattering material 152 that has an average particle size of less than about 150 nm and typically has an average particle size in a range of 100 nm to 150 nm. Alternative embodiments can implement both sets of scattering particles 122 and 152 having the same or substantially the same particle size, e.g., to employ nano-particles in both the wavelength conversion layer 46 and the diffusing layer 44.

The inventive concepts disclosed herein may be applied to wavelength conversion components that encompass any suitable shape. For example, consider the LED light bulb 200 illustrated in FIGS. 15 and 16 which illustrate a perspective view and a cross-sectional view of an application of an LED light bulb that utilizes a wavelength conversion component in accordance with some embodiments. The LED light bulb 200 is intended to be used as an energy efficient replacement for a conventional incandescent or fluorescent light bulb.

The light bulb 200 comprises a screw base 206 that is configured to fit within standard light bulb sockets, e.g. implemented as a standard Edison screw base. The light bulb 200 may further comprise a thermally conductive body 204 fabricated from, for example, die cast aluminum. The body 204 functions as a heat sink and dissipates heat generated by the light emitters 112, which are mounted on a MCPCB (Metal Core Printed Circuit Board). To increase heat radiation from the light bulb 200 and thereby increase cooling of the light bulb 200, the body 204 can include a series of latitudinal radially extending heat radiating fins 207.

The light bulb 200 further comprises a wavelength conversion component 36 having a three-dimensional shape, e.g., elongated dome shape shell having an interior volume defined by its inner surface that encloses the light emitters 112 within the interior volume. The three dimensional wavelength conversion component 36 includes a three-dimensional light transmissive thermally conductive substrate 703 in thermal contact with a three-dimensional wavelength conversion layer 701.

An envelope 208 extends around the upper portion of the LED light bulb 200, enclosing the LEDs 112 and the wavelength conversion component 36. The envelope 208 is a light-transmissive material (e.g. glass or plastic) that provides protective and/or diffusive properties for the LED light bulb 200.

The blue LED device 112 resides on the top surface of the lighting base 204, beneath the wavelength conversion component 36, which comprises both a light diffusing layer 44 and a wavelength conversion layer 46. The three-dimensional nature of the wavelength conversion component 36 creates a relatively large shape that surrounds the interior volume around and above the LEDs 112. Using three-dimensional shapes for the wavelength conversion component 36 in a lighting device 200 allows for certain functional advantages, such as the ability to perform light shaping for the light emitted by the lighting device 200.

However, these types of three-dimensional shapes for the wavelength conversion component 36 also correspond to a relatively large volume for the wavelength conversion component which needs to be populated with adequate amounts of the phosphor materials. With prior art approaches, a significantly large amount of phosphor material would therefore be required to manufacture such wavelength conversion components 36.

Embodiments of the invention may be employed to reduce the amount of phosphor needed to manufacture such wavelength conversion components 36. In particular, the wavelength conversion component 36 comprises a light diffusing layer 44 that is adjacent to a wavelength conversion layer 46, where either or both of these layers may include a light scattering material. Since the scattering material within the wavelength conversion component 36 has the property of scattering light, this reduces the amount of phosphor material that is needed for the wavelength conversion component 36.

In addition, the light diffusing layer 44 also serves to improve the OFF state color appearance of the LED lighting device 200 based at least in part on the properties of the particles of diffracting materials within the diffusing layer 44.

Figure 17:
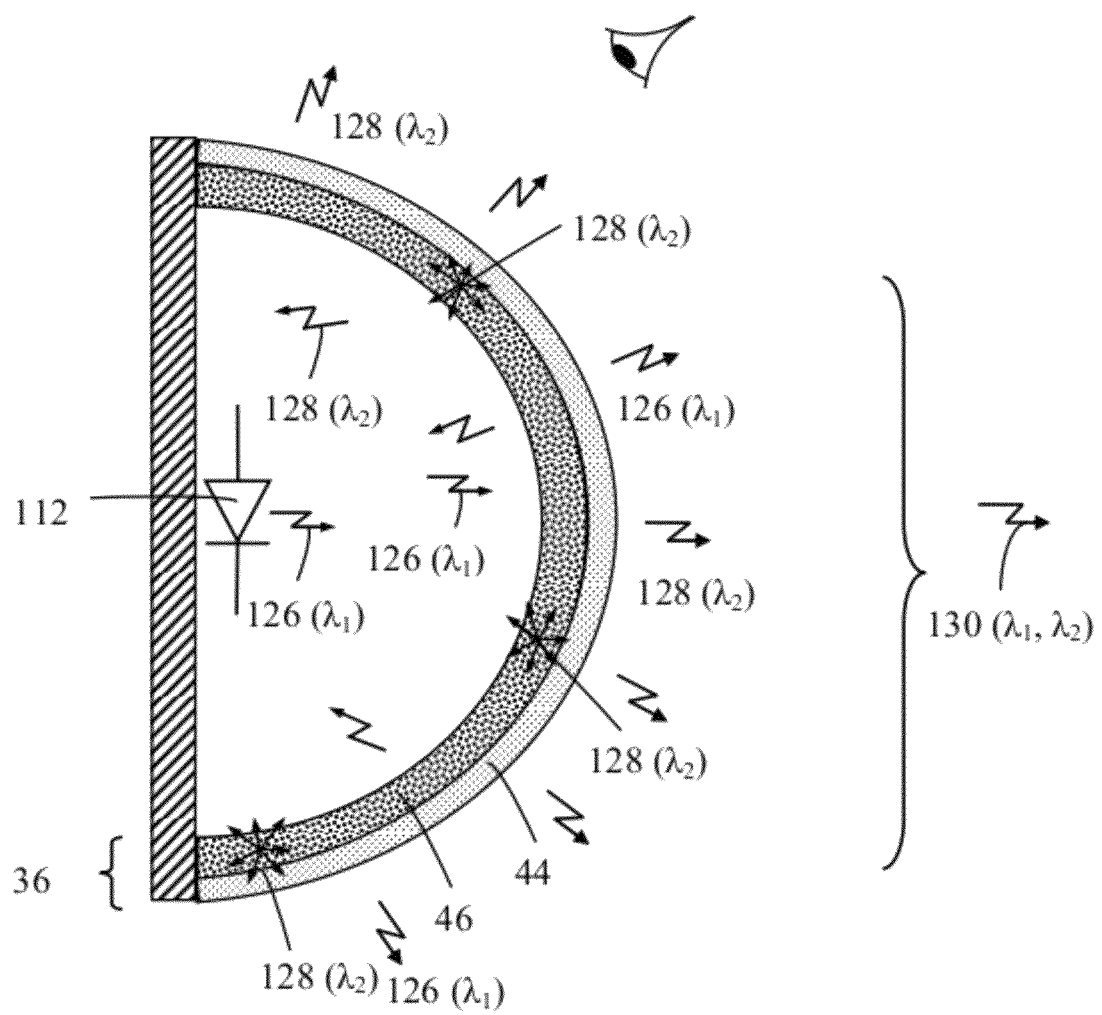
FIG. 17 is a schematic illustrating a light emitting device having a diffusing layer formed as a dome-shaped shell, in which a wavelength conversion layer forms an inner layer on an interior surface of the dome-shaped diffusing layer, according to an embodiment of the invention.

FIG. 17 illustrates an embodiment of the invention comprising a dome-shaped wavelength conversion component 36 that includes a light diffusing layer 44 adjacent to a wavelength conversion layer 46, where either or both the light diffusing layer 44 and the wavelength conversion layer 46 comprise light scattering particles. As with the other described embodiments, the light scattering particles within the light diffusing layer 44 scatters blue light 126 generated by the LEDs 112 more than it scatters light 128 generated by the phosphor material within the wavelength conversion layer 46, which ensures that a higher proportion of the blue light 126 emitted from the wavelength conversion layer 46 will be scattered and directed by the light scattering material 152 back into the wavelength conversion layer 46 increasing the probability of the photon interacting with a phosphor material particles and resulting in the generation of photoluminescence light. At the same time phosphor generated light can pass through the diffusing layer 44 with a lower probability of being scattered. Since the diffusing layer 44 increases the probability of blue photons interacting with a phosphor material particle, less phosphor material can be used to generate an emitted light 130 of a selected emission color that is visible to an observer 21.

Figure 15:
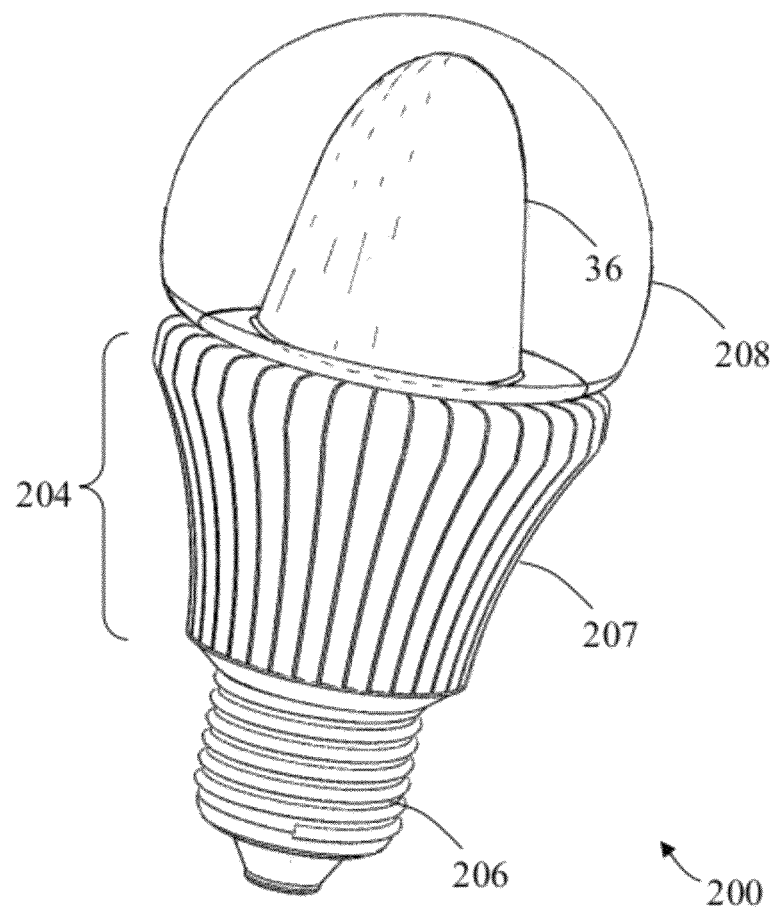
FIGS. 15 and 16 illustrate, respectively, a perspective view and a cross-sectional view of an application of a wavelength conversion component in accordance with some embodiments.
Figure 16:
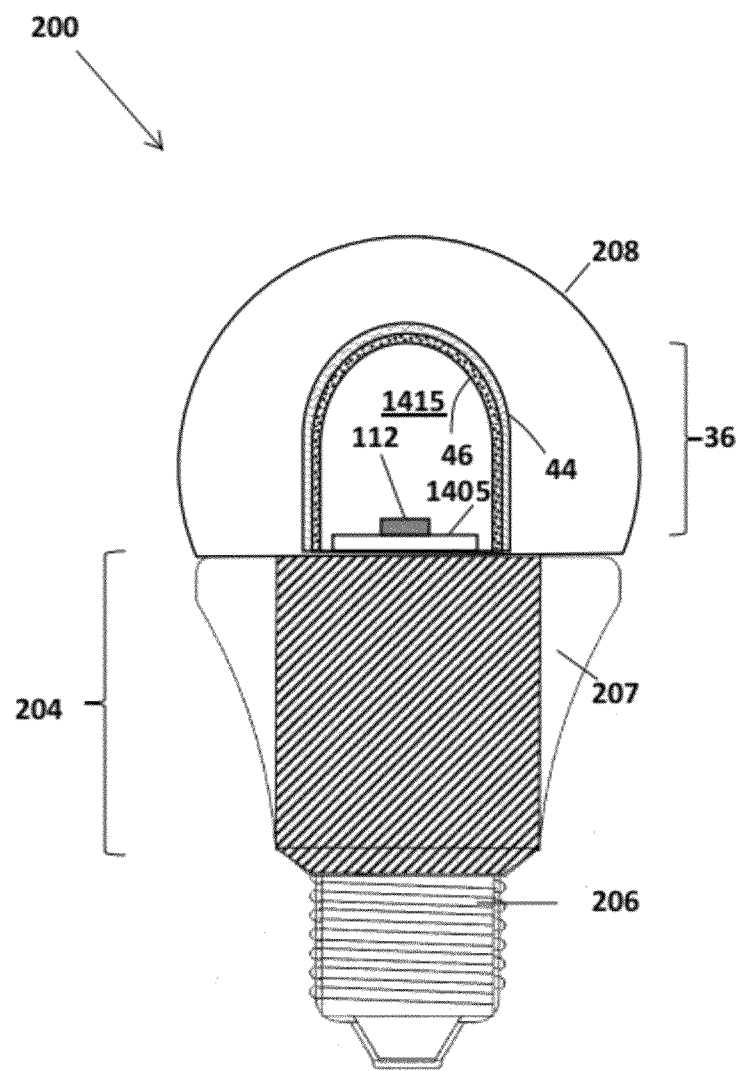

The three-dimensional wavelength conversion components of FIGS. 15-17 can be manufactured using any suitable means. For example, a molding process (e.g., injection molding) can be used to manufacture the two layers of the light diffusing layer 44 and the wavelength conversion layer 46. For the light diffusing layer 44, light diffractive material may be mixed with a solid light-transmissive polymer material, in which the phosphor material and the light-transmissive polymer material undergo a heating process that melts and mixes the phosphor material with the polymer material into a liquid, which is then injected into a mold and then cooled to form the final shape of the light diffusing layer 44. For the wavelength conversion layer 46, a similar molding process may be utilized, in which the phosphor material and the light-transmissive polymer material are heated and drawn into a mold (e.g., the light diffusing layer 44). A heating process will melt and mix the phosphor material with the polymer material, which is then cooled to form the final shape of the wavelength conversion layer 46. Hot runners may be employed to ensure efficient usage of the constituent components for the molding process. Vacuum molding may also be employed to manufacture the three-dimensional wavelength conversion components. In addition, light scattering particles may be introduced into the materials of the wavelength conversion layer 46, thereby reducing the amount of phosphor material that is required.

Figure 18:
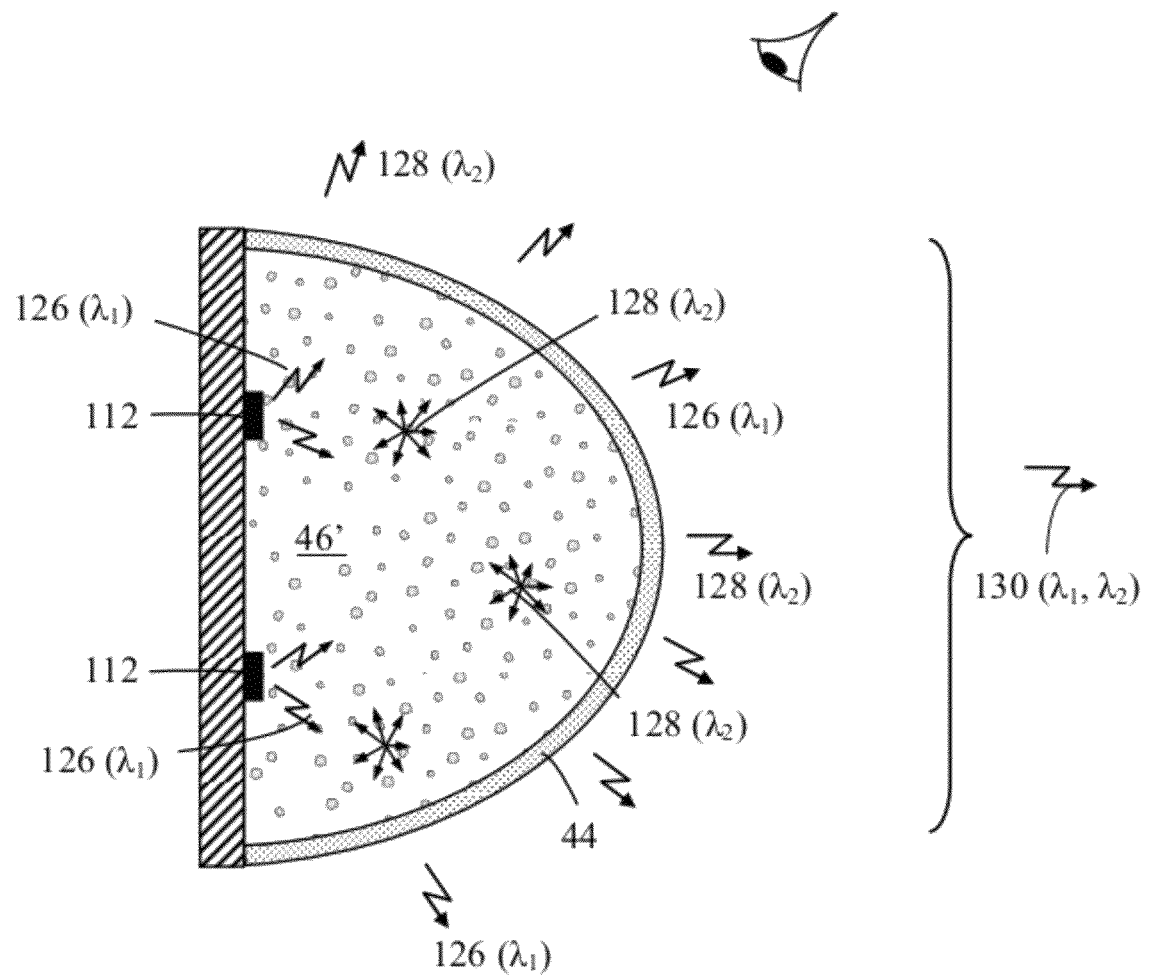
FIG. 18 is a schematic illustrating a light emitting device having a diffusing layer formed as a dome-shaped shell, in which a wavelength conversion layer substantially fills an interior volume formed by the interior surface of the dome-shaped diffusing layer, according to an embodiment of the invention.

FIG. 18 illustrates an alternative embodiment of the invention, comprising a three-dimensional wavelength conversion component 36 that includes a dome-shaped light diffusing layer 44. In this embodiment, the wavelength conversion layer 46' fills a substantial portion of the volume defined by the interior surface of the light diffusing layer 44, rather than being embodied as a thin layer directly adjacent to the light diffusing layer 44 as described in FIG. 17. One possible advantage of the approach of FIG. 17 over the approach of FIG. 18 is the increased conversion efficiency for converting the blue light 126 generated by the LEDs 112 into the light 128 generated by the phosphor material within the wavelength conversion layer 46'. However, a possible disadvantage is the negative performance that may result from excessive heating of the phosphor material within the wavelength conversion layer 46' due to its close proximity to the LEDs 112.

Figure 19:
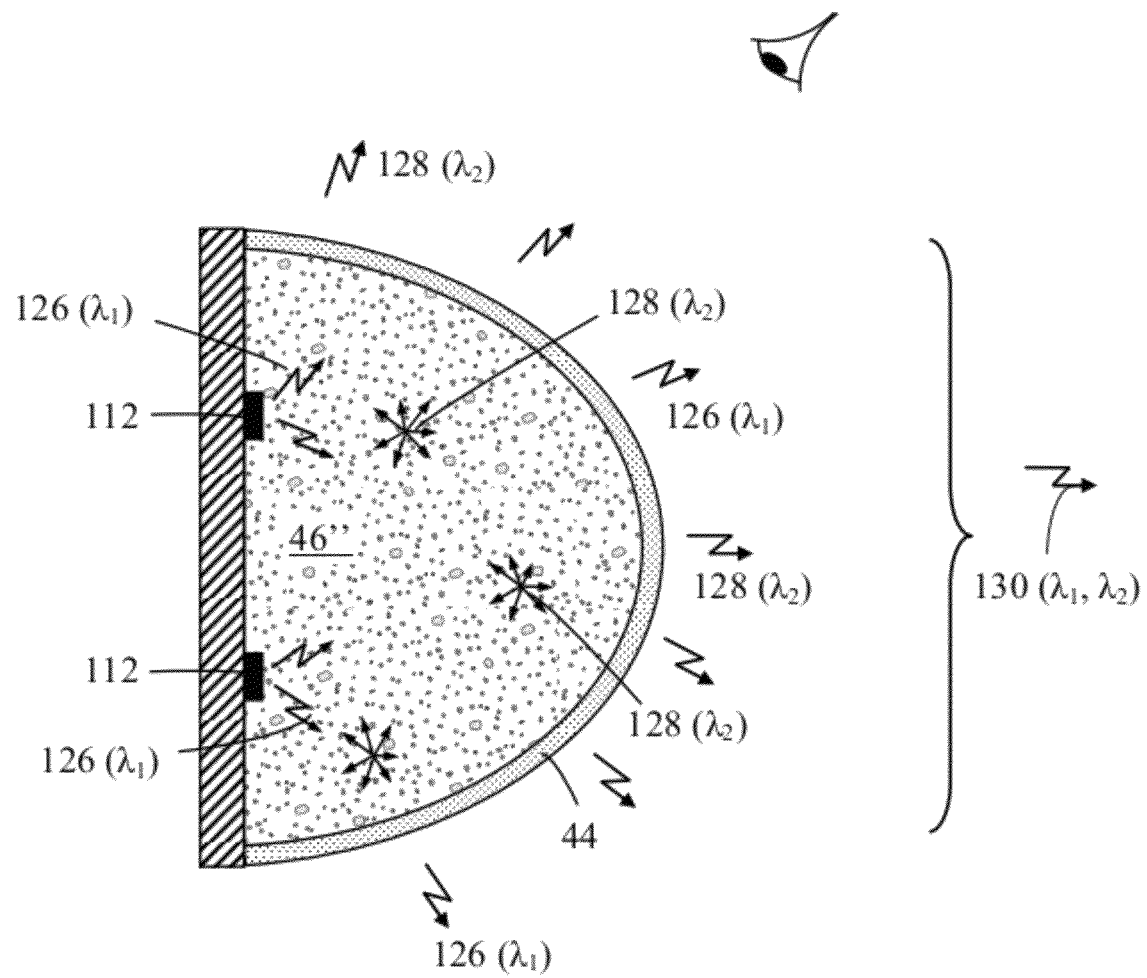
FIG. 19 is a schematic illustrating a light emitting device having a diffusing layer formed as a dome-shaped shell, in which a wavelength conversion layer having scattering particles substantially fills an interior volume formed by the interior surface of the dome-shaped diffusing layer, according to an embodiment of the invention.

FIG. 19 illustrates another embodiment of the invention that comprises a wavelength conversion component 36 with a dome-shaped light diffusing layer 44. In this embodiment, the wavelength conversion layer 46" fills a substantial portion of the volume defined by the light diffusing layer 44, but in which scattering particles are also distributed within the wavelength conversion layer 46". The scattering particles within the wavelength conversion layer 46" has the property of scattering light, which reduces the amount of phosphor material that is needed for the wavelength conversion component 36. In addition, the light diffractive material within the light diffusing layer 44 serves to improve the OFF state color appearance of the LED lighting device 200, while also reducing the amount of phosphor material required for the wavelength conversion layer 46".

The wavelength conversion components of FIGS. 18 and 19 can be manufactured using any suitable means. For example, a molding process (e.g., injection molding or vacuum molding) can be used to manufacture the light diffusing layer 44. For the light diffusing layer 44, light diffractive material may be mixed with a solid light-transmissive polymer material (e.g., in the form of polymer pellets), which are heated and injected into a mold in the desired shape for the light diffusing layer 44. The heating process will melt and mix the light diffractive material with the polymer material in the mold, which is then cooled to form the final shape of the light diffusing layer 44. For the wavelength conversion layer, the phosphor material may be mixed with a liquid binder material, with the resulting mixture poured into the interior volume formed by the inner surfaces of the light diffusing layer 44. A curing process is then employed to cure the wavelength conversion layer not its final form. Scattering particles may also be placed into the phosphor/binder mixture to reduce the amount of phosphor that is required.

Figure 9:
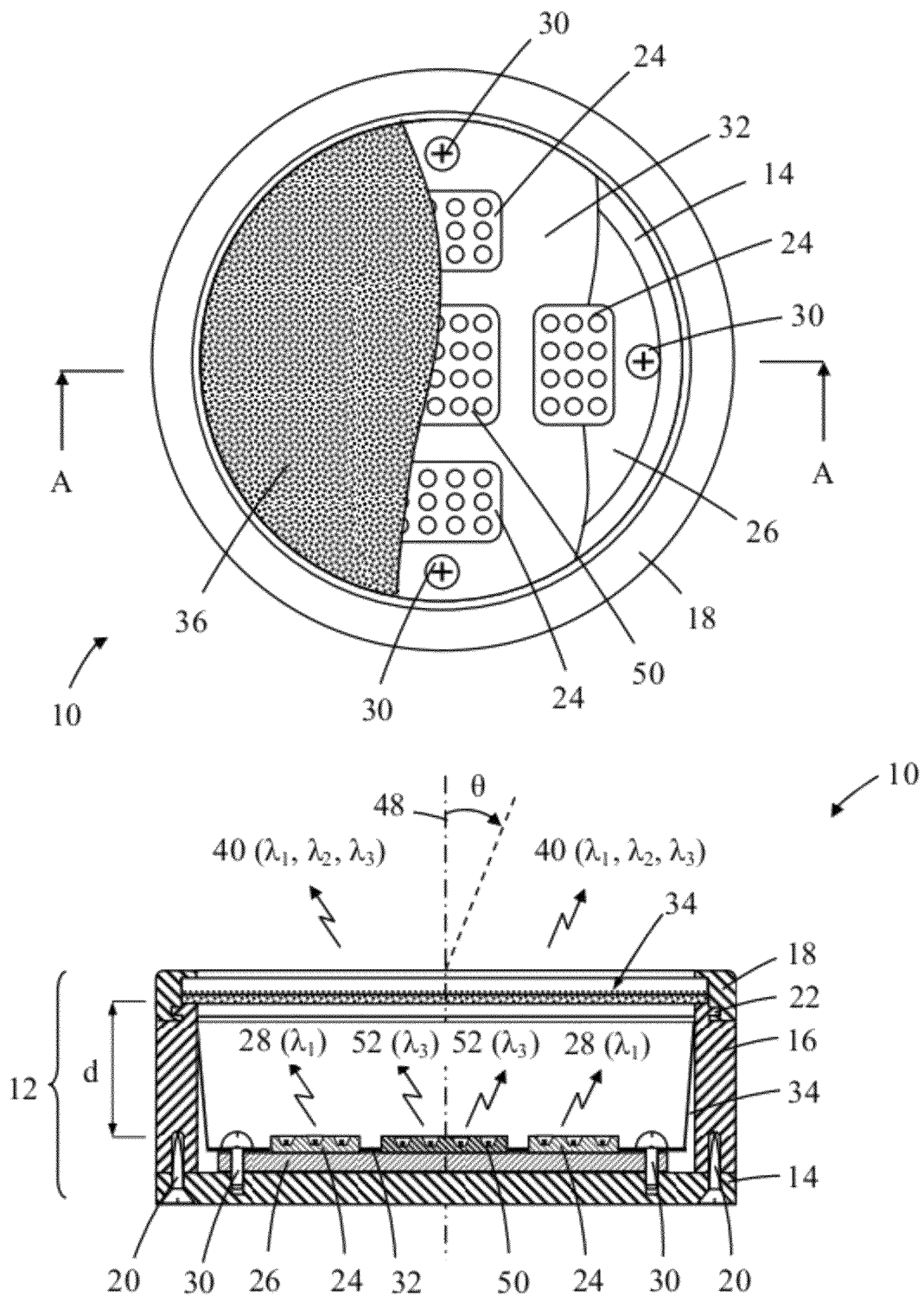
FIG. 9 shows schematic partial cutaway plan and sectional views of a high CRI solid-state light emitting device in accordance with another embodiment of the invention.

A high CRI solid-state light emitting device 10 in accordance with another embodiment of the invention will now be described with reference to FIG. 9 which shows schematic partial cutaway plan and sectional views of the device. The device 10 is configured to generate warm white light with a CCT of ≈3000K, a luminous flux of about 1100 lumens and a CRI (Color Rendering Index) greater than 90. The device 10 is essentially the same as that of FIG. 1 and additionally comprises one or more red light emitting LEDs (red LEDs) 50. As shown in FIG. 9 the red LED(s) can comprise a packaged array of red LED chips. The red LED chips can comprise AlGaAs (aluminum gallium arsenic), GaAsP (gallium arsenic phosphide), AlGaInP (aluminum gallium indium phosphide) or GaP (gallium phosphide) LED that are operable to generate red light 52 having a peak wavelength $\lambda_3$ in a wavelength range 610 nm to 670 nm. The emission product 38 of the device 10 comprises the combined blue 28 ($\lambda_1$) and red 52 ($\lambda_3$) light by generated by the LEDs 24, 50 and photoluminescence light 38 generated by the phosphor wavelength conversion component 36. Operation of the device 10 of FIG. 9 is analogous to that of the device of FIG. 1 and is not described further. Initial tests of the device of FIG. 9 indicate that the light diffusing layer 44 increases the angular emission color uniformity of the device by blending the red, blue and phosphor generated light.

Figure 20A:
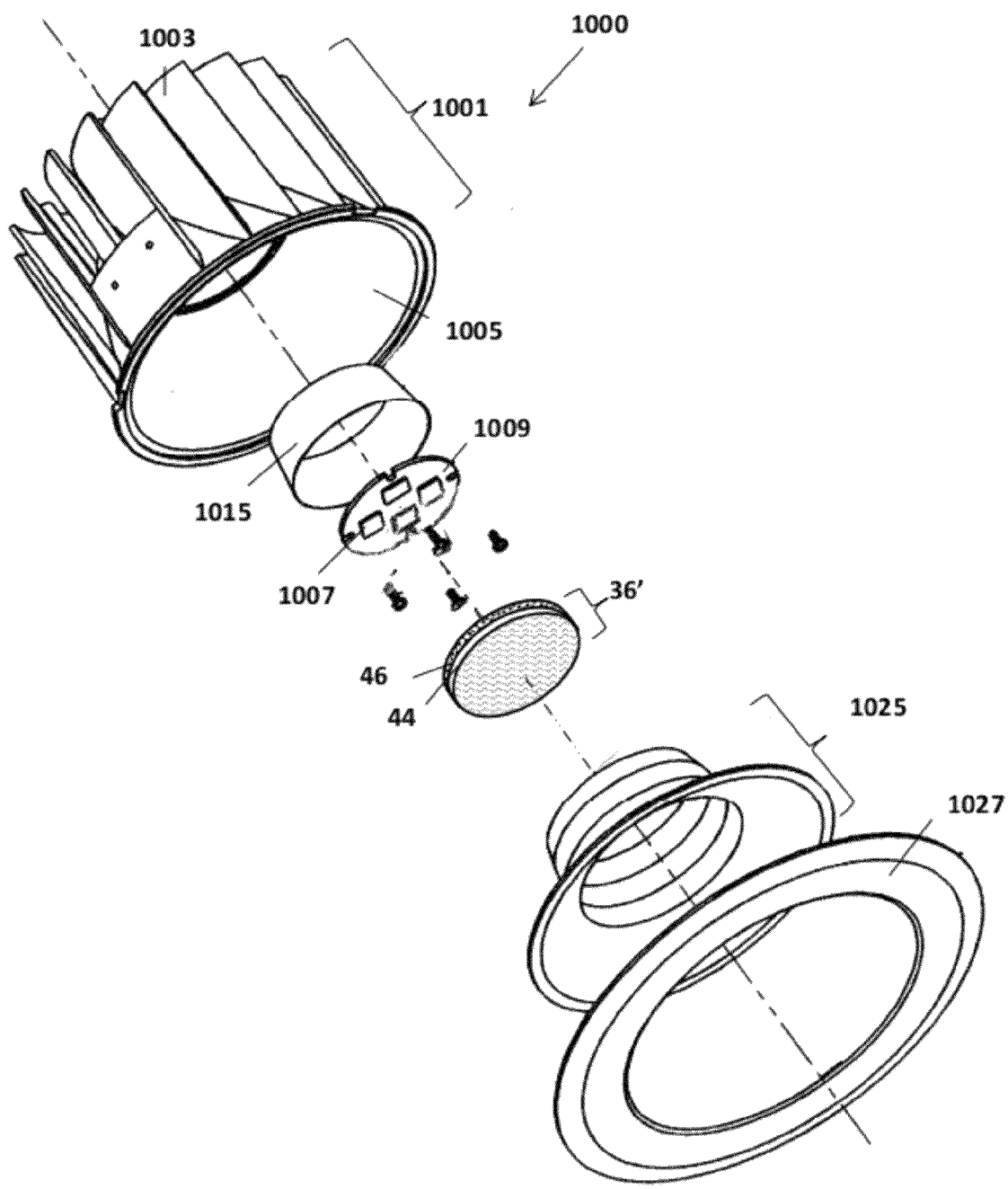
FIGS. 20A, 20B, and 20C illustrate an example of an application of a wavelength conversion component in accordance with some embodiments.
Figure 20B:
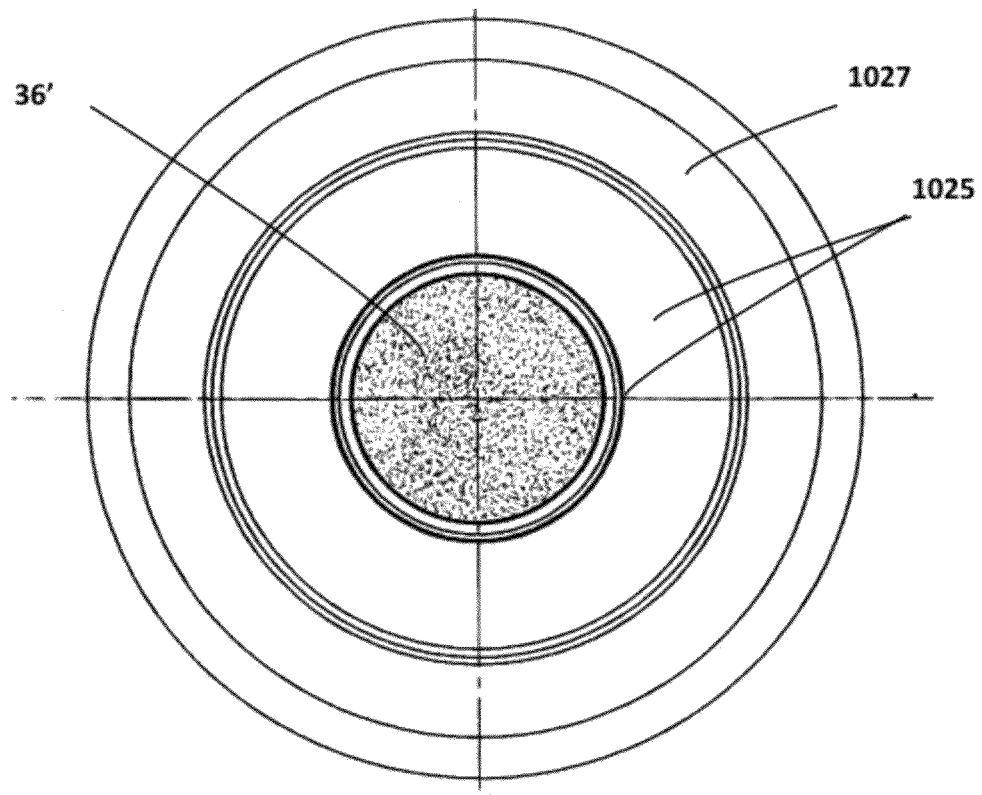
Figure 20C:
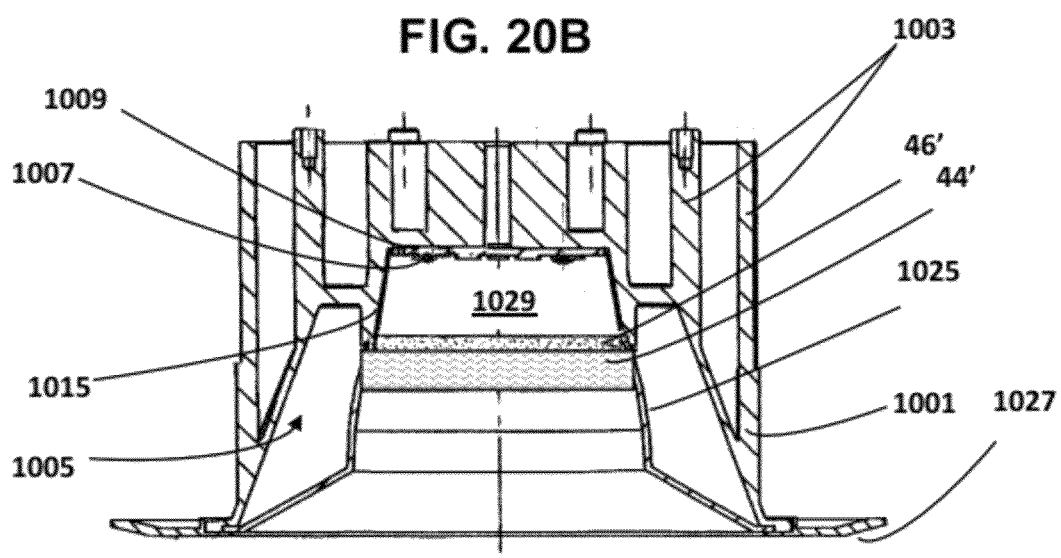

FIGS. 20A, 20B, and 20C illustrate an example of an application of a wavelength conversion component in accordance with some embodiments of the invention. FIGS. 20A, 20B, and 20C illustrates an LED downlight 1000 that utilizes remote wavelength conversion in accordance with some embodiments. FIG. 20A is an exploded perspective view of the LED downlight 1000, FIG. 20B is an end view of the downlight 1000, and FIG. 20C is a sectional view of the downlight 1000. The downlight 1000 is configured to generate light with an emission intensity of 650-700 lumens and a nominal beam spread of 60° (wide flood). It is intended to be used as an energy efficient replacement for a conventional incandescent six inch downlight.

The downlight 1000 comprises a hollow generally cylindrical thermally conductive body 1001 fabricated from, for example, die cast aluminum. The body 1001 functions as a heat sink and dissipates heat generated by the LEDs 1007. To increase heat radiation from the downlight 1000 and thereby increase cooling of the light emitting device 1000, the body 1001 can include a series of latitudinal spirally extending heat radiating fins 1003 located towards the base of the body 1001. To further increase the radiation of heat, the outer surface of the body can be treated to increase its emissivity such as for example painted black or anodized. The body 1001 further comprises a generally frustoconical (i.e. a cone whose apex is truncated by a plane that is parallel to the base) axial chamber 1005 that extends from the front of the body a depth of approximately two thirds of the length of the body. The form factor of the body 1001 is configured to enable the downlight to be retrofitted directly in a standard six inch downlighting fixture (can) as are commonly used in the United States.

Four solid state light emitters 1007 are mounted as a square array on a circular shaped MCPCB 1009. As is known an MCPCB comprises a layered structure composed of a metal core base, typically aluminum, a thermally conducting/electrically insulating dielectric layer and a copper circuit layer for electrically connecting electrical components in a desired circuit configuration. With the aid of a thermally conducting compound such as for example a standard heat sink compound containing beryllium oxide or aluminum nitride the metal core base of the MCPCB 1009 is mounted in thermal communication with the body via the floor of the chamber 1005. The MCPCB 1009 can be mechanically fixed to the body floor by one or more screws, bolts or other mechanical fasteners.

The downlight 1000 further comprises a hollow generally cylindrical light reflective chamber wall mask 1015 that surrounds the array of light emitters 1007. The chamber wall mask 1015 can be made of a plastics material and preferably has a white or other light reflective finish. A wavelength conversion component 36 may be mounted overlying the front of the chamber wall mask 1015 using, for example, an annular steel clip that has resiliently deformable barbs that engage in corresponding apertures in the body. The wavelength conversion component 36 is remote to the light emitting devices 1007.

The wavelength conversion component 36 comprises a light diffusing layer 44 adjacent to a wavelength conversion layer 46 as described above. By placing the wavelength conversion layer 46 adjacent to a light diffusing layer 44, the light scattering particles within the light diffusing layer 44 scatters blue light generated by the light emitters 1007 more than it scatters light generated by the phosphor material within the wavelength conversion layer 46. This ensures that a higher proportion of the blue light emitted from the wavelength conversion layer 46 will be scattered and directed by the light scattering material back into the wavelength conversion layer 46 increasing the probability of the photon interacting with a phosphor material particles and resulting in the generation of photoluminescence light. At the same time phosphor generated light can pass through the diffusing layer 44 with a lower probability of being scattered. Since the diffusing layer 44 increases the probability of blue photons interacting with a phosphor material particle, less phosphor material can be used to generate an emitted light of a selected emission color. In addition, during its OFF state, the diffusing layer 44 also serves to improve the white color of the light 1000.

The downlight 1000 further comprises a light reflective hood 1025 which is configured to define the selected emission angle (beam spread) of the downlight (i.e. 60° in this example). The hood 1025 comprises a generally cylindrical shell with three contiguous (conjoint) inner light reflective frustoconical surfaces. The hood 1025 is preferably made of Acrylonitrile butadiene styrene (ABS) with a metallization layer. Finally the downlight 1025 can comprise an annular trim (bezel) 1027 that can also be fabricated from ABS.

Figure 21A:
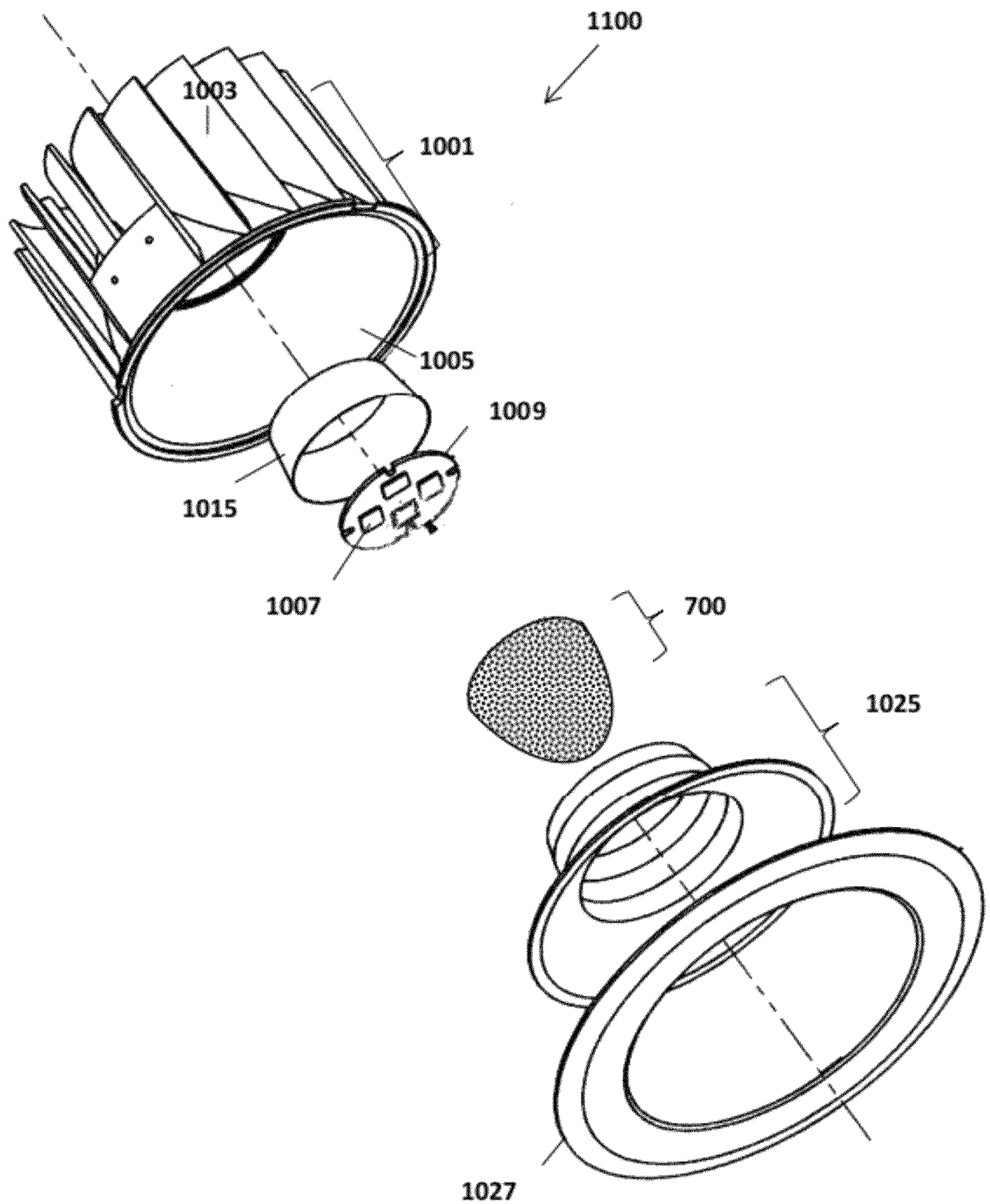
FIGS. 21A, 21B, and 21C illustrate another example of an application of a wavelength conversion component in accordance with some embodiments.
Figure 21B:
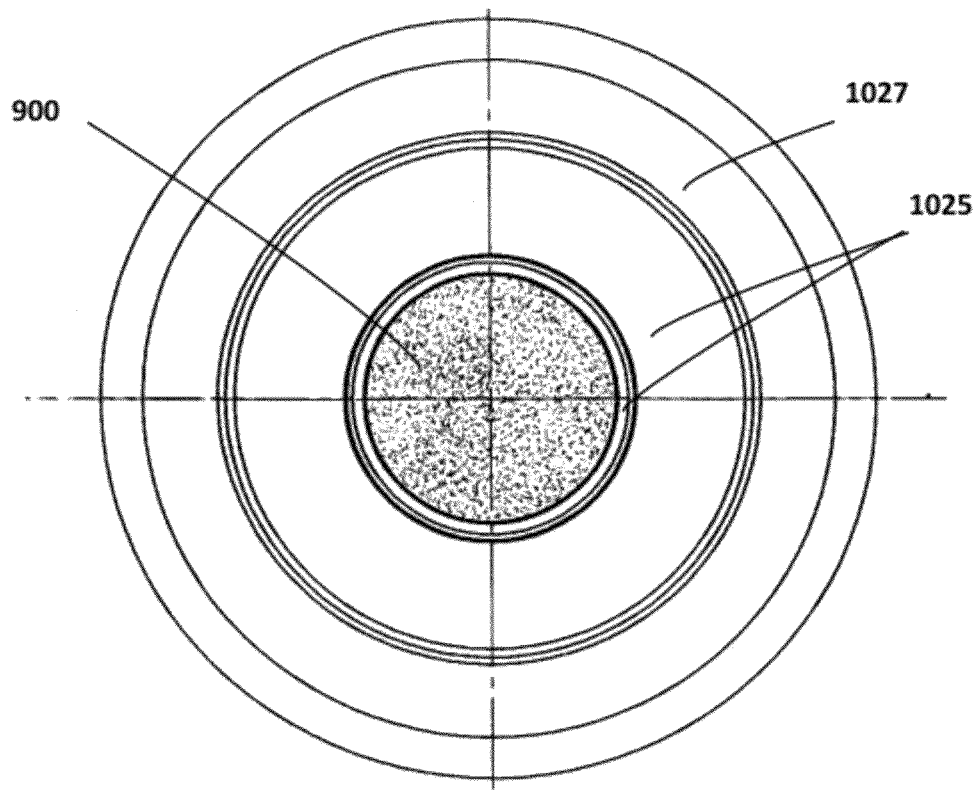
Figure 21C:
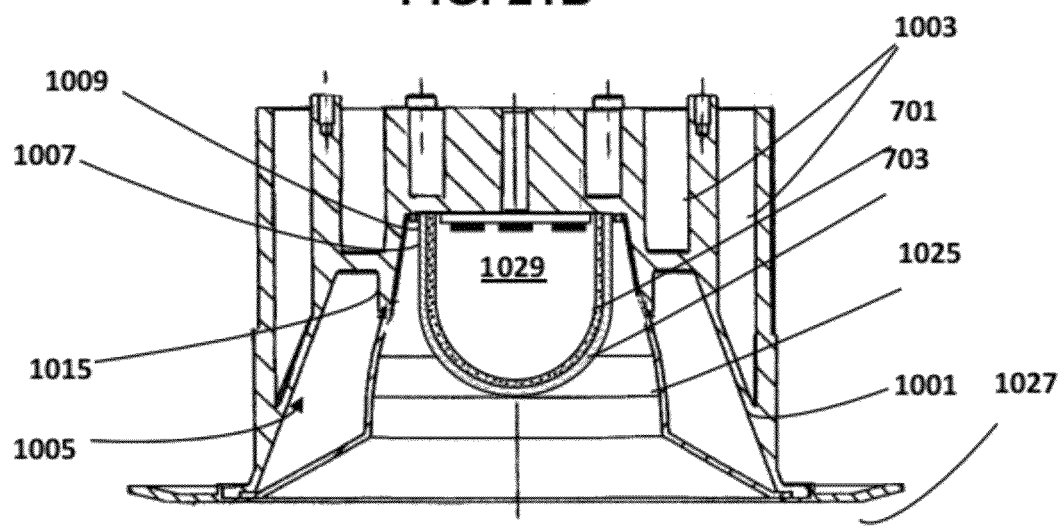

FIGS. 21A, 21B, and 21C illustrate another example of an application of a wavelength conversion component in accordance with some embodiments. FIGS. 21A, 21B, and 21C illustrate an LED downlight 1100 that utilizes remote wavelength conversion in accordance with some embodiments. FIG. 21A is an exploded perspective view of the LED downlight 1100, FIG. 21B is an end view of the downlight 1100, and FIG. 21C is a sectional view of the downlight 1100. The downlight 1100 is configured to generate light with an emission intensity of 650-700 lumens and a nominal beam spread of 60° (wide flood). It is intended to be used as an energy efficient replacement for a conventional incandescent six inch downlight.

The downlight 1100 of FIGS. 21A, 21B, and 21C is substantially the same as the downlight 1000 of FIGS. 20A, 20B, and 20C. For purposes of discussion, only features of the downlight 1100 that are new relative to the embodiments of FIGS. 20A, 20B, and 20C will be described.

Whereas the wavelength conversion component 36 of FIGS. 20A, 20B, and 20C has a two-dimensional shape (e.g., is substantially planar), the wavelength conversion component 700 of FIGS. 21A, 21B, and 21C has a three-dimensional shape (e.g., elongated dome shaped shell). The three dimensional wavelength conversion component 700 includes a three-dimensional light transmissive thermally conductive substrate 703 in thermal contact with a three-dimensional wavelength conversion layer 701, such as the wavelength conversion component 700 described above in FIG. 7. The wavelength conversion component may also be mounted enclosing the front of the chamber wall mask 1015.

As discussed above, by placing the wavelength conversion layer 701 adjacent to a light diffusing layer 703, the light scattering particles within the light diffusing layer 703 scatters blue light generated by the light emitters 1007 more than it scatters light generated by the phosphor material within the wavelength conversion layer 701. This ensures that a higher proportion of the blue light emitted from the wavelength conversion layer 701 will be scattered and directed by the light scattering material back into the wavelength conversion layer 700 increasing the probability of the photon interacting with a phosphor material particles and resulting in the generation of photoluminescence light. Therefore, less phosphor material is required to generate an emitted light of a selected emission color. In addition, during its OFF state, the diffusing layer 703 also improves the white color of the light 1100.

Figure 22:
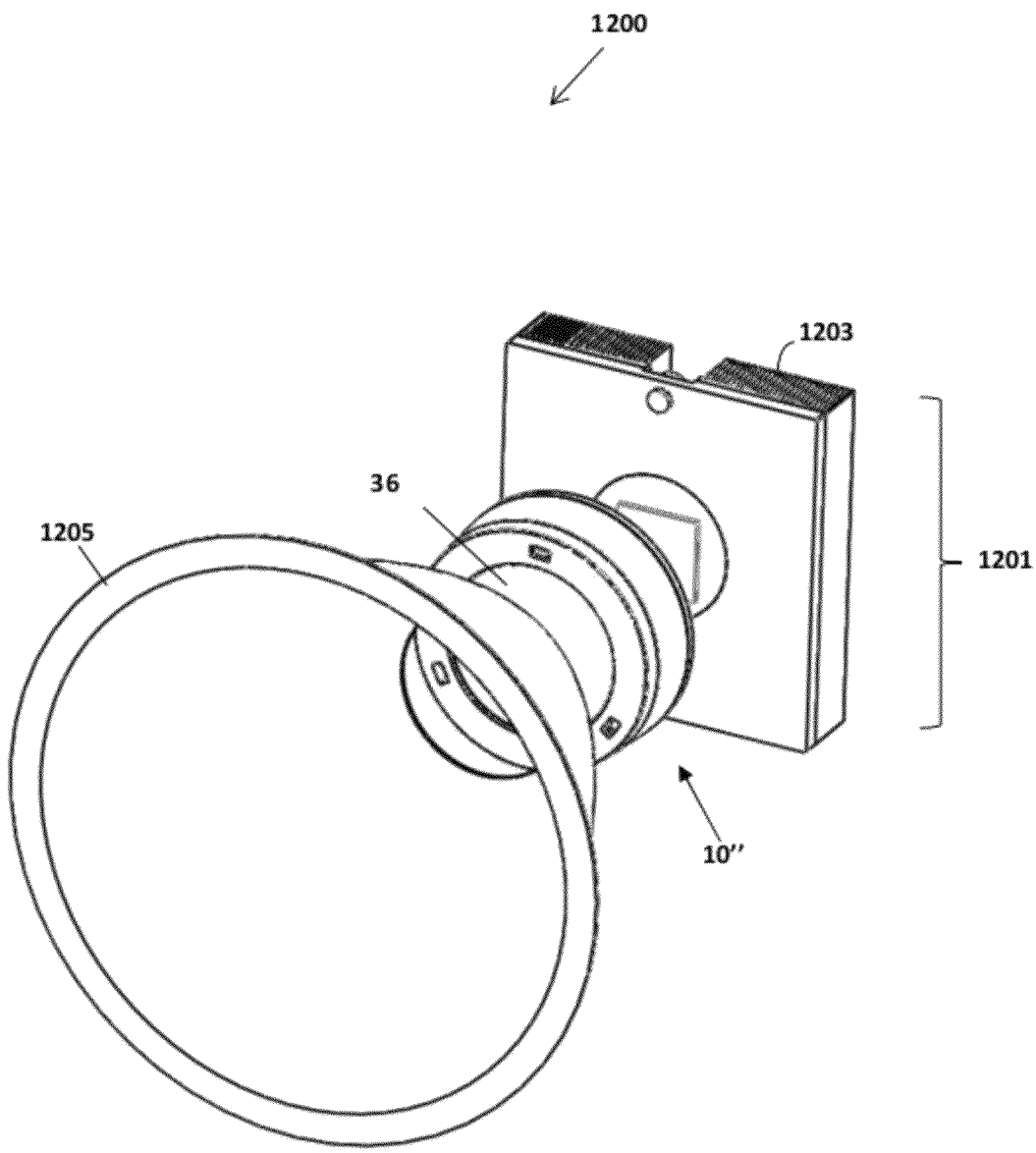
FIG. 22 illustrates another example of an application of a wavelength conversion component in accordance with some embodiments.

FIG. 22 illustrates another example of an application of a wavelength conversion component in accordance with some embodiments, showing an exploded perspective view of a reflector lamp 1200 that utilizes remote wavelength conversion in accordance with some embodiments. The reflector lamp 1200 is configured to generate light with an emission intensity of 650-700 lumens and a nominal beam spread of 60° (wide flood). It is intended to be used as an energy efficient replacement for a conventional incandescent six inch downlight.

The reflector lamp 1200 comprises a generally rectangular thermally conductive body 1201 fabricated from, for example, die cast aluminum. The body 1201 functions as a heat sink and dissipates heat generated by the light emitting device 10" To increase heat radiation from the reflector lamp 1000 and thereby increase cooling of the light emitting device 10", the body 1201 can include a series of heat radiating fins 1203 located on the sides of the body 1201. The form factor of the body 1201 is configured to enable the reflector lamp to be retrofitted directly in a standard six inch downlighting fixture (a "can") as are commonly used in the United States.

The wavelength conversion component 36 may be implemented to have a wavelength conversion layer that is adjacent to a light diffusing layer, such that the light scattering particles within the light diffusing layer scatters blue light more than it scatters light generated by the phosphor material within the wavelength conversion layer. Therefore, less phosphor material is required to generate an emitted light of a selected emission color. In addition, during its OFF state, the diffusing layer also improves the white color of the light 1200.

The reflector lamp 1200 further comprises a generally frustroconical light reflector 1205 having a paraboloidal light reflective inner surface which is configured to define the selected emission angle (beam spread) of the downlight (i.e. 60° in this example). The reflector 1205 is preferably made of Acrylonitrile butadiene styrene (ABS) with a metallization layer.

Figure 23A:
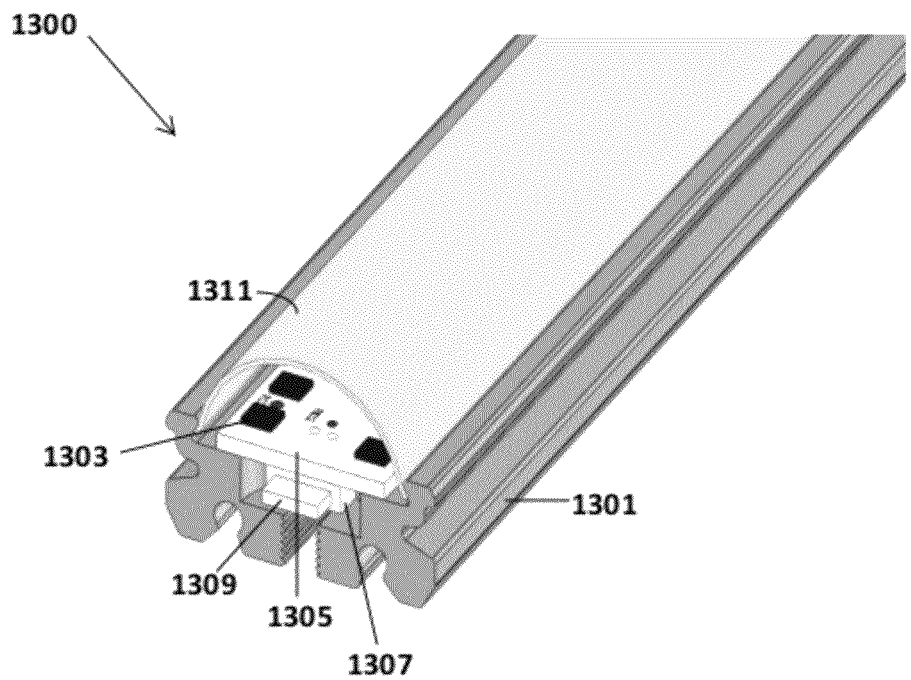
FIGS. 23A and 23B illustrate another example of an application of a wavelength conversion component in accordance with some embodiments.
Figure 23B:
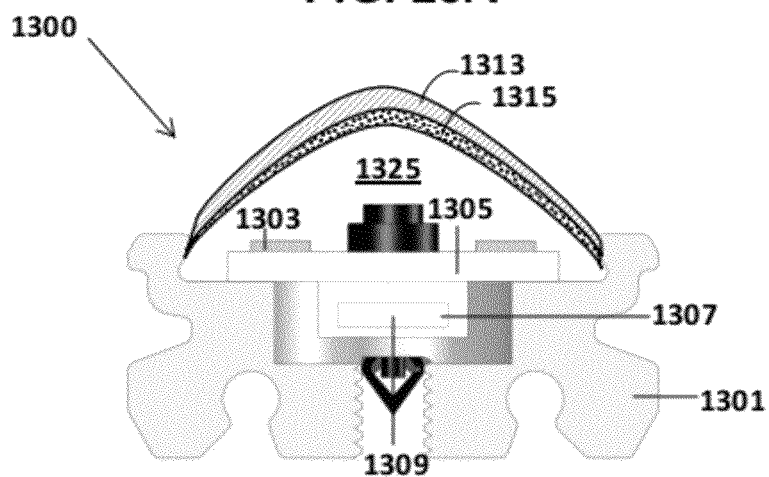

FIGS. 23A and 23B illustrate another example of an application of a wavelength conversion component in accordance with some embodiments. FIGS. 23A and 23B illustrate an LED linear lamp 1300 that utilizes remote wavelength conversion in accordance with some embodiments. FIG. 23A is a three-dimensional perspective view of the linear lamp 1300 and FIG. 23B is a cross-sectional view of the linear lamp 1300. The LED linear lamp 1300 is intended to be used as an energy efficient replacement for a conventional incandescent or fluorescent tube lamp.

The linear lamp 1300 comprises an elongated thermally conductive body 1301 fabricated from, for example, extruded aluminum. The form factor of the body 1301 can be configured to be mounted with a standard linear lamp housing. The body 1301 further comprises a first recessed channel 1304, wherein a rectangular tube-like case 1307 containing some electrical components (e.g., electrical wires) of the linear lamp 1300 may be situated. The case 1307 may further comprise an electrical connector 1309 (e.g., plug) extending past the length of the body 1301 on one end, and a recessed complimentary socket (not shown) configured to receive a connector on another end. This allows several linear lamps 1300 to be connected in series to cover a desired area. Individual linear lamps 1300 may range from 1 foot to 6 feet in length.

The body 1301 functions as a heat sink and dissipates heat generated by the light emitters 1303. To increase heat radiation from the linear lamp 1300 and thereby increase cooling of the light emitters 1303, the body 1301 can include a series of heat radiating fins 1302 located on the sides of the body 1301. To further increase heat radiation from the linear lamp 1300, the outer surface of the body 1301 can be treated to increase its emissivity such as for example painted black or anodized.

Light emitters 1303 are mounted on a strip (rectangular shaped) MCPCB 1305 configured to sit above the first recessed channel 1304. The under surface of the MCPCB 1305 sits in thermal contact with a second recessed channel 1306 that includes inclined walls 1302.

A generally hemi-spherical elongate wavelength conversion component 1311 may be positioned remote to the light emitters 1303. The wavelength conversion component 1311 may be secured within the second recessed channel 1306 by sliding the wavelength conversion component 1311 under the inclined walls 1308 such that the wavelength conversion component 1311 engages with inclined walls 1308.

The wavelength conversion component 1311 may include a hemi-spherical elongate light diffusing layer 1313 and a hemi-spherical elongate wavelength conversion layer 1315. As discussed above, less phosphor material is required to generate an emitted light of a selected emission color. In addition, during its OFF state, the diffusing layer also improves the white color of the light 1300.

In alternative embodiments, the wavelength conversion component of the linear lamp may be configured in the shape of a generally planar strip. In such embodiments, it will be appreciated that the second recessed channel may instead have vertical walls that extend to allow the wavelength conversion component to be received by the second recessed channel.

Figure 24:
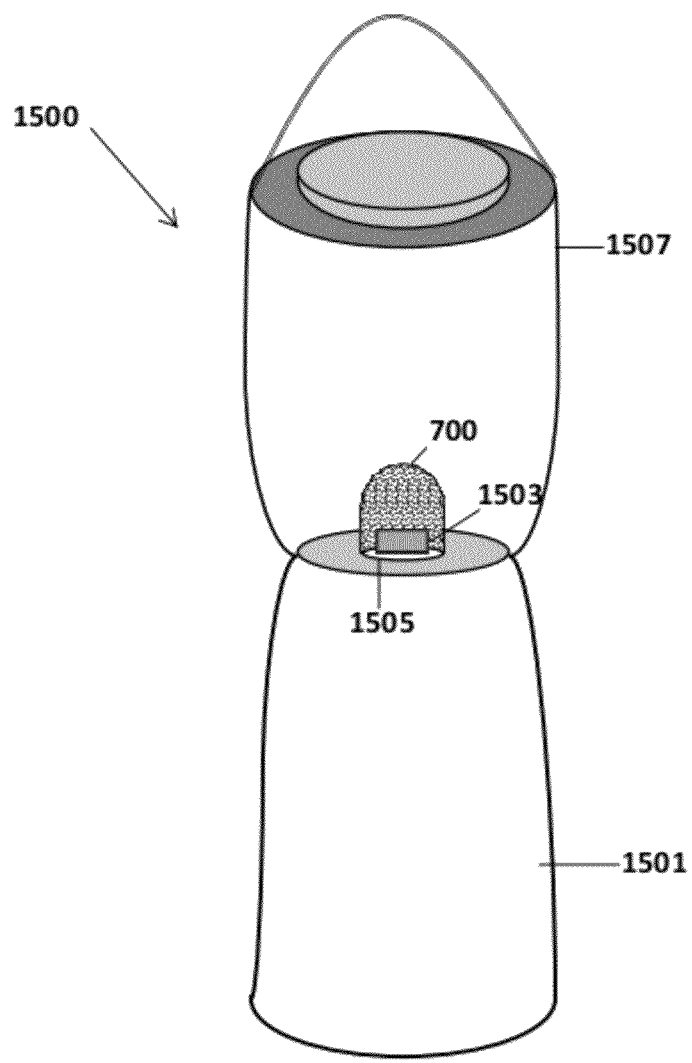
FIG. 24 illustrates a perspective of another application of a wavelength conversion component in accordance with some embodiments.

FIG. 24 illustrates a perspective of another application of a wavelength conversion component in accordance with some embodiments. FIG. 24 illustrates an LED lantern 1500 that utilizes remote wavelength conversion. The LED light lantern 1500 is intended to be used as an energy efficient replacement for conventional gas and fluorescent lanterns (e.g., camping lanterns).

The lantern 1500 comprises a generally cylindrical thermally conductive body 1501 fabricated from, for example, plastic material or pressed metal. The body 1501 further includes an internal heat sink which dissipates heat generated by the light emitters 1503, which are mounted on a circular shaped MCPCB 1505. The MCPCB 1505 may be in thermal contact with the body 1501.

The lantern 1500 comprises a three-dimensional (e.g., elongated dome shaped shell) wavelength conversion component 700, such as the one described above in FIG. 17, 18 or 19, that extends from the MCPCB 1505. While only an exterior surface of the wavelength conversion component 700 is depicted, it is important to note that the three dimensional wavelength conversion component 700 may include a three-dimensional light diffusing layer adjacent to a three-dimensional wavelength conversion layer. As discussed above, this configuration permits less phosphor material to be used to generate an emitted light of a selected emission color. In addition, during its OFF state, the diffusing layer also improves the white color of the light.

A light transmissive cover (e.g., plastic) 1507 may extend around the upper portion of the lantern, surrounding the LEDs 1503 and the wavelength conversion component 900. The light transmissive cover 1507 comprises a light-transmissive material (e.g. glass or plastic) that provides protective and/or diffusive properties for the LED lantern 1500. The lantern 1500 may further comprise a lid that sits on top of the glass receptacle to enclose the light emitters 1503 and the wavelength conversion component 700.

The above applications of light emitting devices describe a remote wavelength conversion configuration, wherein a wavelength conversion component is remote to one or more light emitters. The wavelength conversion component and body of those light emitting devices define an interior volume wherein the light emitters are located. The interior volume may also be referred to as a light mixing chamber. For example, in the downlight 1000, 1100 of FIGS. 20A, 20B, 20C, 21A, 21B, and 21C, an interior volume 1029 is defined by the wavelength conversion component 36', 700, the light reflective chamber mask 1015, and the body of the downlight 1001. In the linear lamp 1300 of FIGS. 23A and 23B, an interior volume 1325 is defined by the wavelength conversion component 1311 and the body of the linear lamp 1301. In the light bulb 200 of FIGS. 15 and 16, an interior volume 1415 is defined by the wavelength conversion component 36 and the body of the light bulb 204. Such an interior volume provides a physical separation (air gap) of the wavelength conversion component from the light emitters that improves the thermal characteristics of the light emitting device. Due to the isotropic nature of photoluminescence light generation, approximately half of the light generated by the phosphor material can be emitted in a direction towards the light emitters and can end up in the light mixing chamber. It is believed that on average as little as 1 in a 10,000 interactions of a photon with a phosphor material particle results in absorption and generation of photoluminescence light. The majority, about 99.99%, of interactions of photons with a phosphor particle result in scattering of the photon. Due to the isotropic nature of the scattering process on average half the scattered photons will be in a direction back towards the light emitters. As a result up to half of the light generated by the light emitters that is not absorbed by the phosphor material can also end up back in the light mixing chamber. To maximize light emission from the device and to improve the overall efficiency of the light emitting device the interior volume of the mixing chamber includes light reflective surfaces to redirect—light in—the interior volume towards the wavelength conversion component and out of the device. The light mixing chamber may be operated to mix light within the chamber. The light mixing chamber can be defined by the wavelength conversion component in conjunction with another component of the device such a device body or housing (e.g., dome-shaped wavelength conversion component encloses light emitters located on a base of device body to define light mixing chamber, or planar wavelength conversion component placed on a chamber shaped component to enclose light emitters located on a base of device body and surrounded by the chamber shaped component to define light mixing chamber). For example, the downlight 1000, 1100 of FIGS. 20A, 20B, 20C, 21A, 21B, and 21C, includes an MCPCB 1009, on which the light emitters 1007 are mounted, comprising light reflective material and a light reflective chamber wall mask 1015 to facilitate the redirection of light reflected back into the interior volume towards the wavelength conversion component 36', 700. The linear lamp 1300 of FIGS. 23A and 23B includes an MCPCB 1305, on which the light emitters 1303 are mounted, comprising light reflective material to facilitate the redirection of light reflected back into the interior volume towards the wavelength conversion component 1311. The light bulb 200 of FIGS. 12A and 12B also includes an MCPCB 1405 on which the light emitters 112 are mounted, to facilitate the redirection of light reflected back into the interior volume towards the wavelength conversion component 36.

The above applications of light emitting devices describe only a few embodiments with which the claimed invention may be applied. It is important to note that the claimed invention may be applied to other types of light emitting device applications, including but not limited to, wall lamps, pendant lamps, chandeliers, recessed lights, track lights, accent lights, stage lighting, movie lighting, street lights, flood lights, beacon lights, security lights, traffic lights, headlamps, taillights, signs, etc.

Therefore, what has been described is a novel wavelength conversion component that comprises a light diffusing layer. Light diffractive particles within the light diffusing layer are selected to have a size such that the particles will scatter blue light generated by the LED relatively more than they will scatter light generated by a wavelength conversion layer, e.g., where the particles have an average particle size that is less than about 150 nm. This approach of using the light diffusing layer in combination with the wavelength conversion layer solves the problem of variations or non-uniformities in the color of emitted light with emission angle. In addition, the color appearance of the lighting apparatus in its OFF state can be improved by implementing the light diffusing layer in combination with the wavelength conversion layer. Moreover, significant reductions can be achieved in the amount phosphor materials that is required to implement phosphor-based LED devices.

It will be appreciated that the invention is not limited to the exemplary embodiments described and that variations can be made within the scope of the invention. For example whilst the devices of the invention have been described as comprising one or more LEDs the devices can comprise other solid-state light sources such as a laser diode or laser.

What is claimed is:
1. A wavelength conversion component for a light emitting device comprising:
   a light diffusing layer comprising particles of a light scattering material, wherein the light diffusing layer has a shape with an inner surface that defines an interior volume;
   a wavelength conversion layer comprising particles of at least one photoluminescence material within the interior volume,
   wherein the light diffusing layer improves an off-state white appearance of the wavelength conversion component; and
   wherein the wavelength conversion component is configured such that in operation a portion of excitation light comprising blue light having a wavelength of greater than or equal to 440 nm generated by the light emitting device is emitted through the wavelength conversion component to contribute to a final visible emission product.

2. The component of claim 1, wherein the shape comprises a dome shape or an elongated dome shape.

3. The component of claim 1, wherein the wavelength conversion layer substantially fills the interior volume of the shape of the light diffusing layer.

4. The component of claim 1, wherein the wavelength conversion layer comprises the same shape as the light diffusing layer.

5. The component of claim 1, wherein the wavelength conversion layer comprises a mixture of the at least one phosphor material and a light transmissive binder and the light diffusing layer comprises a mixture of the light scattering material and the light transmissive binder.

6. The component of claim 5, wherein the wavelength conversion layer further comprises a second light scattering material.

7. The component of claim 6, wherein the light scattering material and the second light scattering material have different material properties.

8. The component of claim 5, wherein the light transmissive binder comprises a curable liquid polymer selected from the group consisting of: a polymer resin, a monomer resin, an acrylic, an epoxy, a silicone and a fluorinated polymer.

9. The component of claim 5, wherein the weight loading of light scattering material to binder selected from the group consisting of: 7% to 35% and 10% to 20%.

10. The component of claim 1, wherein the light scattering material has an average particle size in a range selected from the group consisting of: 1 µm to 50 µm and 10 µm to 20 µm.

11. The component of claim 1, wherein the light diffusing layer is formed using a molding process.

12. The component of claim 11, wherein the molding process comprises a vacuum molding or an injection molding process.

13. The component of claim 11, wherein the wavelength conversion layer is formed using a molding process.

14. The component of claim 11, wherein the wavelength conversion layer is formed by depositing phosphor material with a binder material into the interior volume of the light diffusing layer.

15. The component of claim 1, wherein the light scattering material is selected from the group consisting of: titanium dioxide, barium sulfate, magnesium oxide, silicon dioxide and aluminum oxide.

16. The component of claim 1, wherein the light scattering material has an average particle size that is selected such that the light scattering material will scatter excitation light relatively more than the light scattering material will scatter light generated by the at least one photoluminescence material.

17. The component of claim 16, wherein the light scattering material scatters the excitation light at least twice as much as light generated by the at least one photoluminescence material.

18. The component of claim 16, wherein the excitation light comprises blue light.

19. The component of claim 18, wherein the light scattering material has an average particle size that is less than about 150 nm.

20. The component of claim 16, wherein the excitation light comprises ultraviolet light.

21. The component of claim 18, wherein the light scattering material has an average particle size that is less than about 100 nm.

22. The component of claim 1, wherein the diffusing layer is deposited on a light transmissive substrate, and the light transmissive substrate is selected from the group consisting of: a polycarbonate, an acrylic and a glass.

23. A light emitting device, comprising:
at least one solid-state light emitter operable to generate excitation light; and
a wavelength conversion component comprising:
a light diffusing layer comprising particles of a light scattering material, wherein the light diffusing layer has a shape with an inner surface that defines an interior volume;
a wavelength conversion layer comprising particles of at least one photoluminescence material within the interior volume that is excitable by the excitation light,
wherein the light diffusing layer improves an OFF state white appearance of the wavelength conversion component;
wherein the wavelength conversion component is configured such that in operation a portion of light comprising blue light having a wavelength of greater than or equal to 440 nm generated by the at least one solid-state light emitter is emitted through the wavelength conversion component to contribute to a final visible emission product.

24. The device of claim 23, wherein the light emitting device is selected from the group consisting of: downlights, light bulbs, linear lamps, lanterns, wall lamps, pendant lamps, chandeliers, recessed lights, track lights, accent lights, stage lighting, movie lighting, street lights, flood lights, beacon lights, security lights, traffic lights, headlamps, taillights, and signs.

25. The device of claim 23 in which the light scattering material within the light diffusing layer corresponds to an average particle size that improves the OFF state white appearance of the wavelength conversion component.

26. The device of claim 23, wherein the light scattering material has an average particle size in a range selected from the group consisting of: 1 μm to 50 m and 10 μm to 20 μm.

27. The device of claim 23, wherein the excitation light comprises blue light and the light scattering material scatters the blue light at least twice as much as light generated by the at least one photoluminescence material.

28. The device of claim 27, wherein the light scattering material has an average particle size that is less than about 150 nm.

29. A linear lamp comprising:
an elongate housing;
a plurality of solid-state light emitters housed within the housing and configured along the length of the housing; and
an elongate wavelength conversion component remote to the plurality of solid-state light emitters and configured to in part at least define a light mixing chamber,
wherein the elongate wavelength conversion component comprises
a light diffusing layer comprising particles of a light scattering material, wherein the light diffusing layer has a shape with an inner surface that defines an interior volume; and
a wavelength conversion layer comprising particles of at least one photoluminescence material within the interior volume,
wherein the light diffusing layer improves an off-state white appearance of the elongate wavelength conversion component;
wherein the elongate wavelength conversion component is configured such that in operation a portion of light comprising blue light having a wavelength of greater than or equal to 440 nm generated by the plurality of solid-state light emitters is emitted through the wavelength conversion component to contribute to a visible final emission product.

30. A downlight comprising:
a body comprising one or more solid-state light emitters, wherein the body is configured to be positioned within a downlighting fixture such that the downlight emits light in a downward direction; and
a wavelength conversion component remote to the one or more solid-state light emitters and configured to in part at least define a light mixing chamber,
wherein the wavelength conversion component comprises
a light diffusing layer comprising particles of a light scattering material, wherein the light diffusing layer has a shape with an inner surface that defines an interior volume; and
a wavelength conversion layer comprising particles of at least one photoluminescence material within the interior volume,
wherein the light diffusing layer improves an off-state white appearance of the wavelength conversion component;
wherein the wavelength conversion component is configured such that in operation a portion of light comprising blue light having a wavelength of greater than or equal to 440 nm generated by the one or more solid-state light emitters is emitted through the wavelength conversion component to contribute to a final visible emission product.

31. A light bulb comprising:
a connector base configured to be inserted in a socket to form an electrical connection for the light bulb;
a body comprising one or more solid-state light emitters;

a wavelength conversion component having a three dimensional shape that is configured to enclose the one or more solid-state light emitters and to in part at least define a light mixing chamber, wherein the wavelength conversion component comprises
- a light diffusing layer comprising particles of a light scattering material, wherein the light diffusing layer has a shape with an inner surface that defines an interior volume; and
- a wavelength conversion layer comprising particles of at least one photoluminescence material within the interior volume, wherein the light diffusing layer improves an off-state white appearance of the wavelength conversion component;

wherein the wavelength conversion component is configured such that in operation a portion of light comprising blue light having a wavelength of greater than or equal to 440 nm generated by the one or more solid-state light emitters is emitted through the wavelength conversion component to contribute to a final visible emission product.

* * * * *